US012635289B2

(12) United States Patent
Kim et al.

(10) Patent No.: US 12,635,289 B2
(45) Date of Patent: May 19, 2026

(54) METHOD FOR MANUFACTURING A DISPLAY DEVICE USING A SEMICONDUCTOR LIGHT EMITTING DEVICE AND A SELF-ASSEMBLY APPARATUS USED THEREFOR

(71) Applicant: LG ELECTRONICS INC., Seoul (KR)

(72) Inventors: Soohyun Kim, Seoul (KR); Dohan Kim, Seoul (KR); Wonseok Choi, Seoul (KR); Youngdo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 1035 days.

(21) Appl. No.: 17/778,691

(22) PCT Filed: Nov. 26, 2019

(86) PCT No.: PCT/KR2019/016320
§ 371 (c)(1),
(2) Date: May 20, 2022

(87) PCT Pub. No.: WO2021/100947
PCT Pub. Date: May 27, 2021

(65) Prior Publication Data
US 2023/0045160 A1     Feb. 9, 2023

(30) Foreign Application Priority Data

Nov. 22, 2019    (KR) ........................ 10-2019-0151577

(51) Int. Cl.
H10H 20/01        (2025.01)
G01R 1/073        (2006.01)
(Continued)

(52) U.S. Cl.
CPC ............. H10H 20/01 (2025.01); G01R 1/073 (2013.01); G01R 27/02 (2013.01); H10W 90/00 (2026.01)

(58) Field of Classification Search
CPC . H01L 2224/95085; H01L 2224/95101; H01L 24/95; H01L 25/0753; H10H 20/01; (Continued)

(56) References Cited

U.S. PATENT DOCUMENTS 8,299,473  B1     10/2012  D'Evelyn et al.
2002/0130820  A1     9/2002  Sullivan
(Continued)

FOREIGN PATENT DOCUMENTS

CN          1305619  A      7/2001
CN          101473439  A     7/2009
(Continued)

*Primary Examiner* — Matthew C Landau
*Assistant Examiner* — Halee Cramer
(74) *Attorney, Agent, or Firm* — Birch, Stewart, Kolasch & Birch, LLP

(57)          ABSTRACT

Discussed is a method of manufacturing a display device, the method including: introducing semiconductor light emitting devices including a magnetic material into a fluid chamber; transferring a substrate to the fluid chamber, the substrate including assembly electrodes, an insulating layer covering the assembly electrodes, and open holes in the insulating layer and exposing portions of both ends of the assembly electrodes; applying a magnetic force to the semiconductor light emitting devices introduced into the fluid chamber to move the semiconductor light emitting devices in one direction; and forming an electric field so that the moving semiconductor light emitting devices are disposed at preset positions of the substrate, wherein a probe pin is in contact with the assembly electrodes exposed through the
(Continued)

open holes to individually apply a voltage to the assembly electrodes to form the electric field.

16 Claims, 19 Drawing Sheets

(51) Int. Cl.
G01R 27/02 (2006.01)
H10W 90/00 (2026.01)

(58) Field of Classification Search
CPC ... G01R 1/073; H10P 74/207; H10P 72/0446; H10W 90/00
See application file for complete search history.

(56) References Cited

U.S. PATENT DOCUMENTS

| | | | |
|---|---|---|---|
| 2004/0097005 A1 | 5/2004 | Daniels | |
| 2004/0257520 A1* | 12/2004 | Yoshimura | G02F 1/13394 |
| | | | 349/187 |
| 2005/0265009 A1 | 12/2005 | Fussinger et al. | |
| 2016/0116768 A1 | 4/2016 | Okuyama et al. | |
| 2016/0163765 A1* | 6/2016 | Hu | H10H 20/8506 |
| | | | 438/34 |

| | | | |
|---|---|---|---|
| 2017/0061895 A1 | 3/2017 | Paolini, Jr. et al. | |
| 2017/0062748 A1* | 3/2017 | Jung | H10F 77/50 |
| 2019/0115233 A1* | 4/2019 | Chen | H01L 25/167 |
| 2019/0128829 A1 | 5/2019 | Meyer et al. | |
| 2019/0181316 A1 | 6/2019 | Noh et al. | |
| 2019/0325790 A1 | 10/2019 | Park et al. | |
| 2019/0326477 A1 | 10/2019 | Kim et al. | |
| 2022/0367774 A1 | 11/2022 | Kim et al. | |

FOREIGN PATENT DOCUMENTS

| | | |
|---|---|---|
| CN | 102176465 A | 9/2011 |
| CN | 109478110 A | 3/2019 |
| CN | 110096897 A | 8/2019 |
| JP | 2012-4535 A | 1/2012 |
| KR | 10-2015-0006798 A | 1/2015 |
| KR | 10-2019-0017691 A | 2/2019 |
| KR | 10-2019-0067543 A | 6/2019 |
| KR | 10-2019-0085892 A | 7/2019 |
| KR | 10-2019-0113695 A | 10/2019 |
| KR | 10-2019-0122113 A | 10/2019 |
| KR | 10-2019-0122117 A | 10/2019 |
| KR | 10-2145193 B1 | 8/2020 |
| WO | WO 02/17362 A2 | 2/2002 |
| WO | WO 2014/005147 A2 | 1/2014 |
| WO | WO2019/075050 A1 | 4/2019 |

* cited by examiner

[Figure 1]
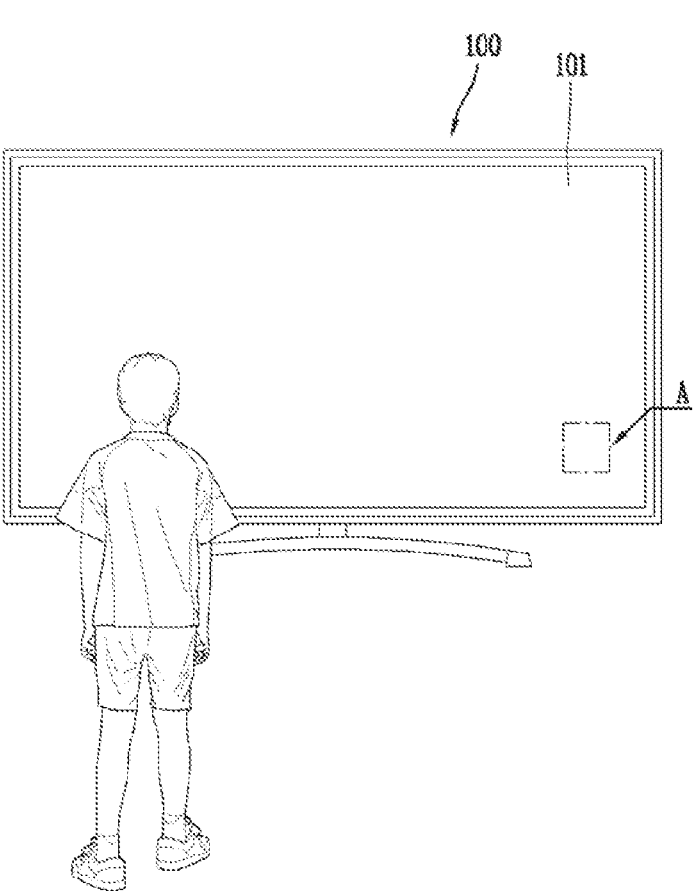

[Figure 2]
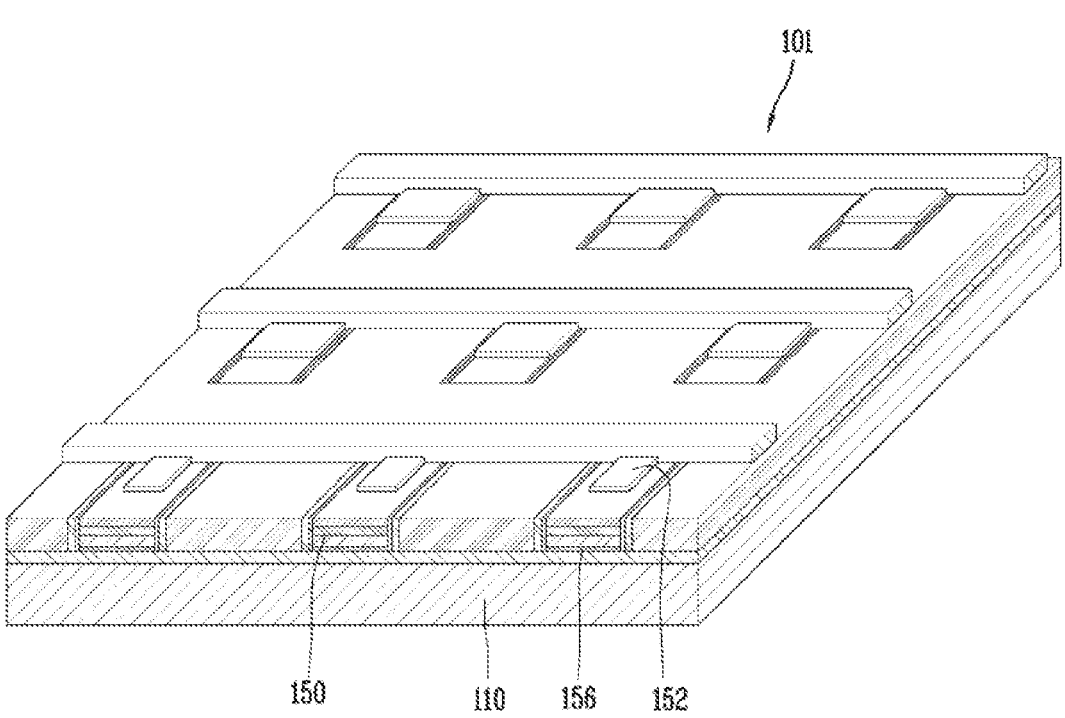
[Figure 3]
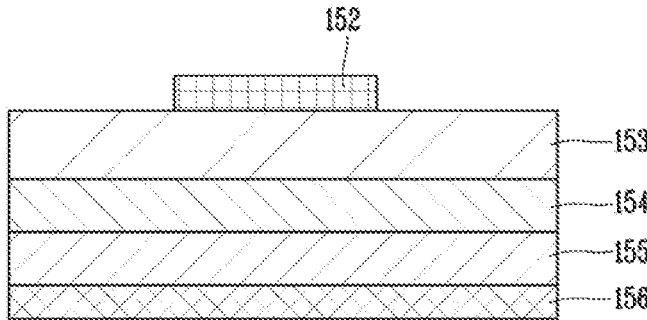

[Figure 4]
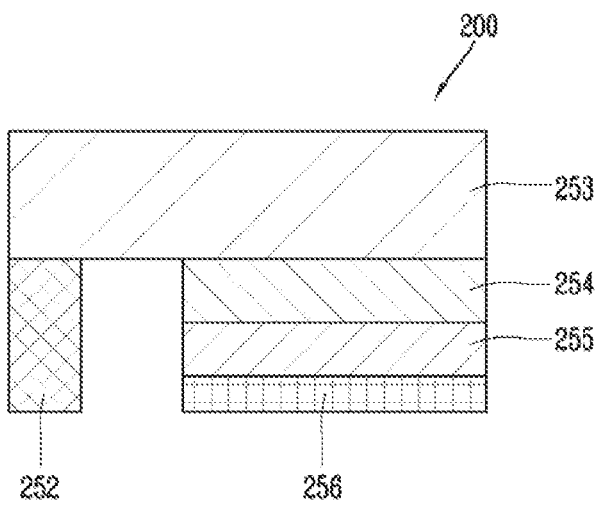
[Figure 5a]
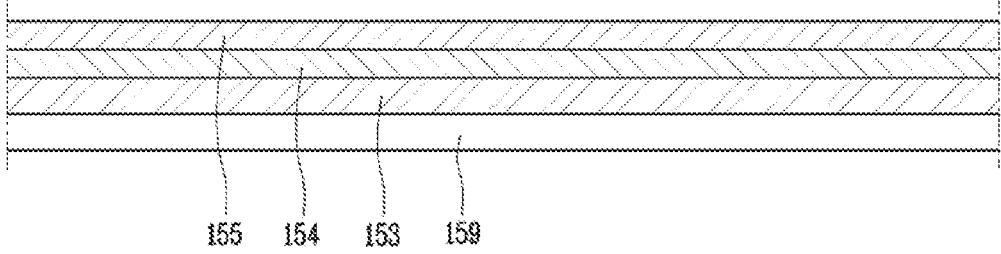
[Figure 5b]
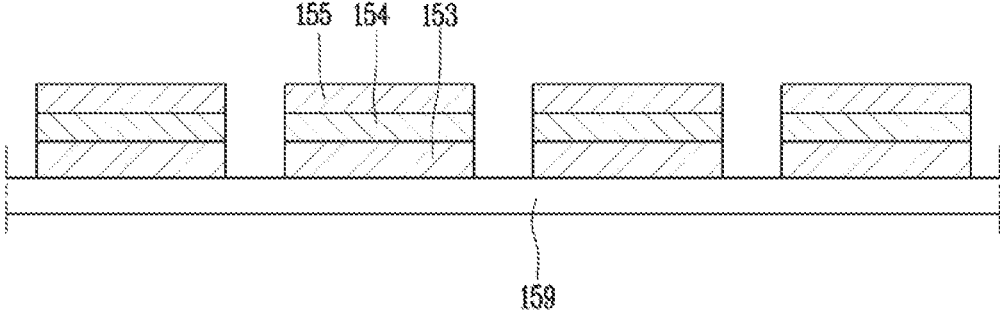

[Figure 5c]
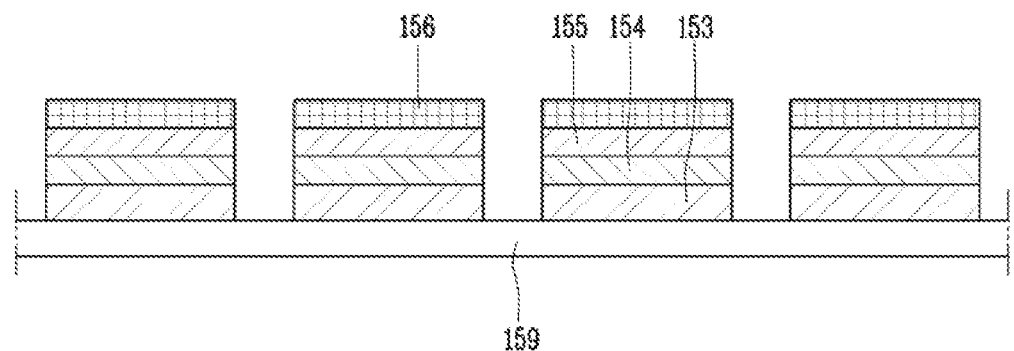
[Figure 5d]
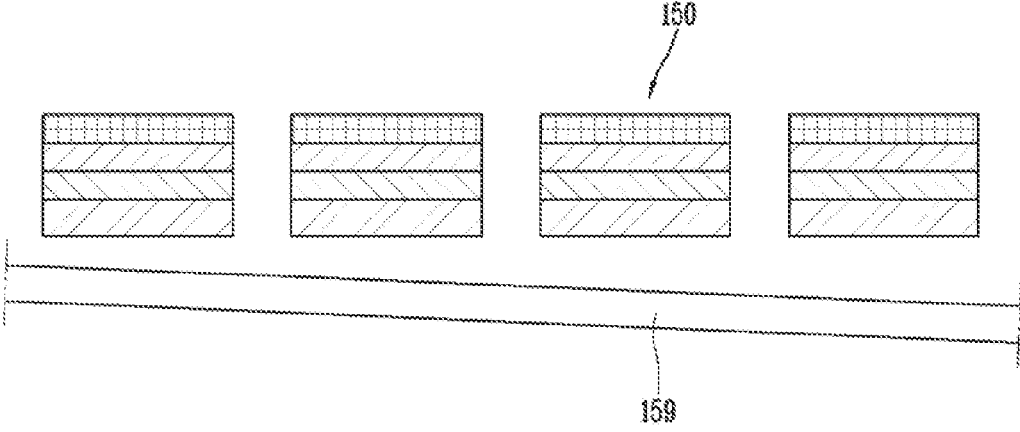
[Figure 5e]
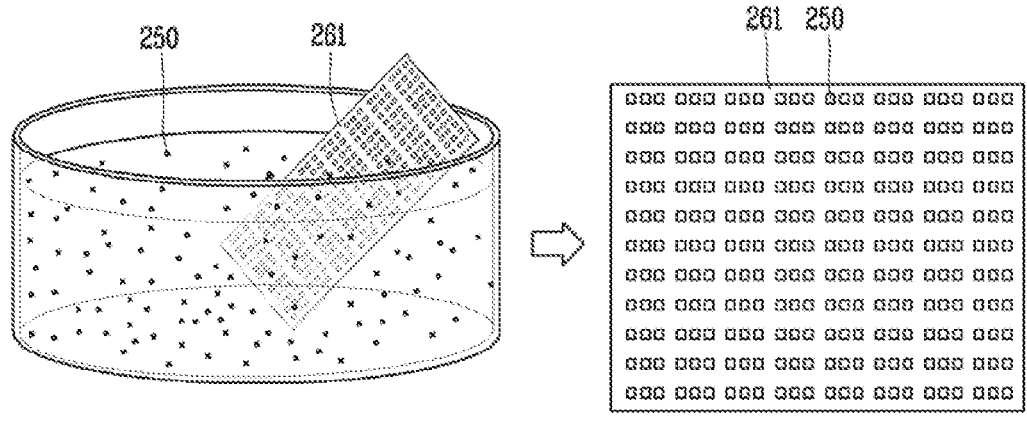

[Figure 6]
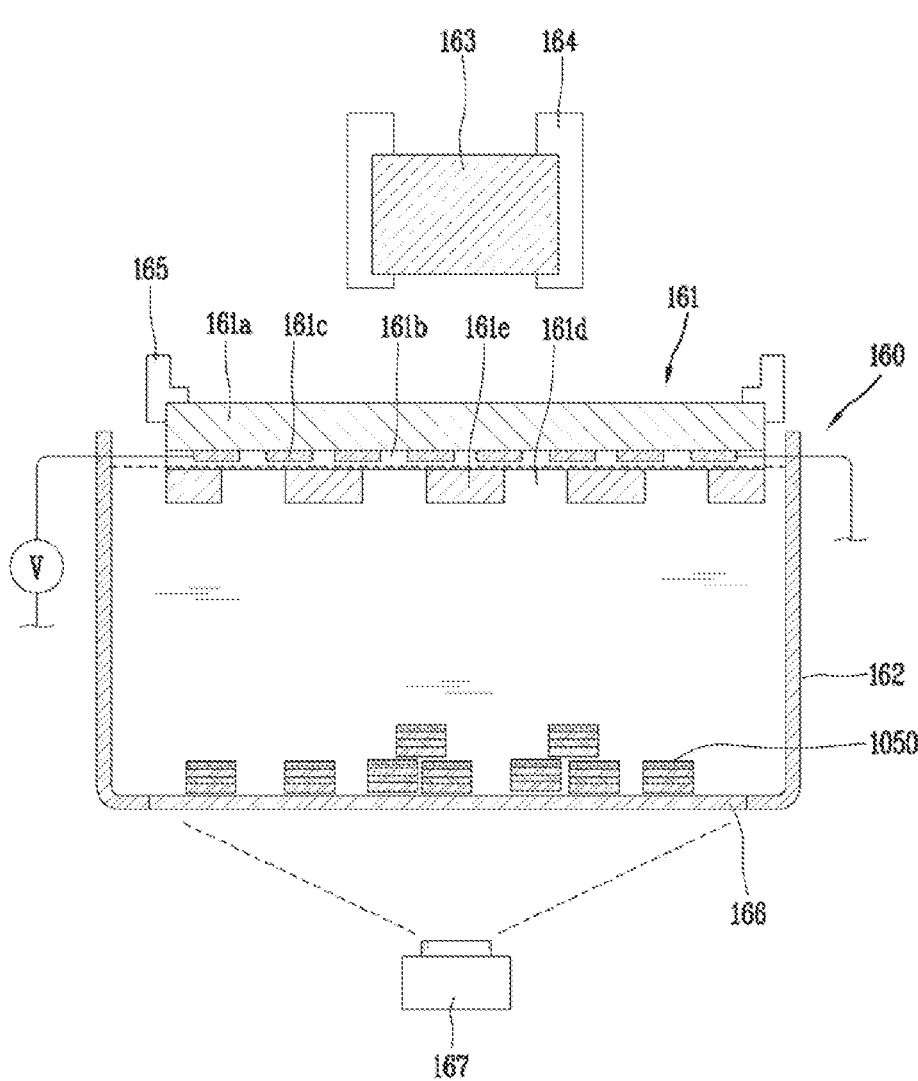

[Figure 7]
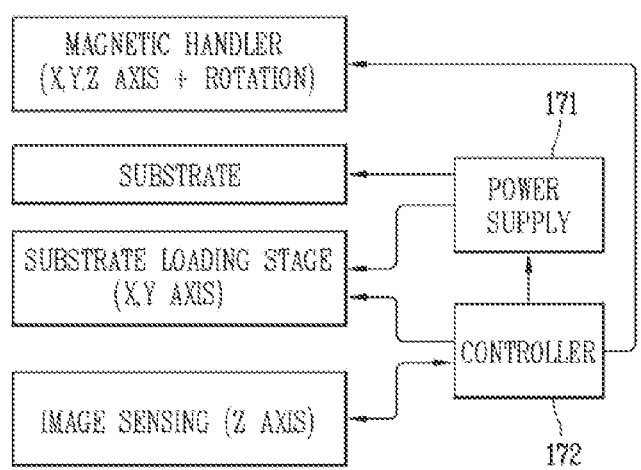
[Figure 8a]
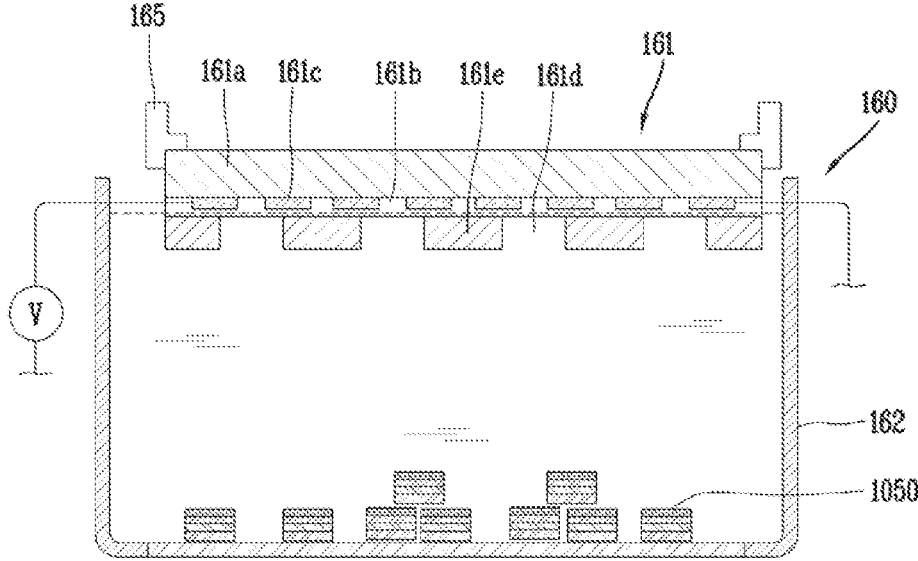

[Figure 8b]
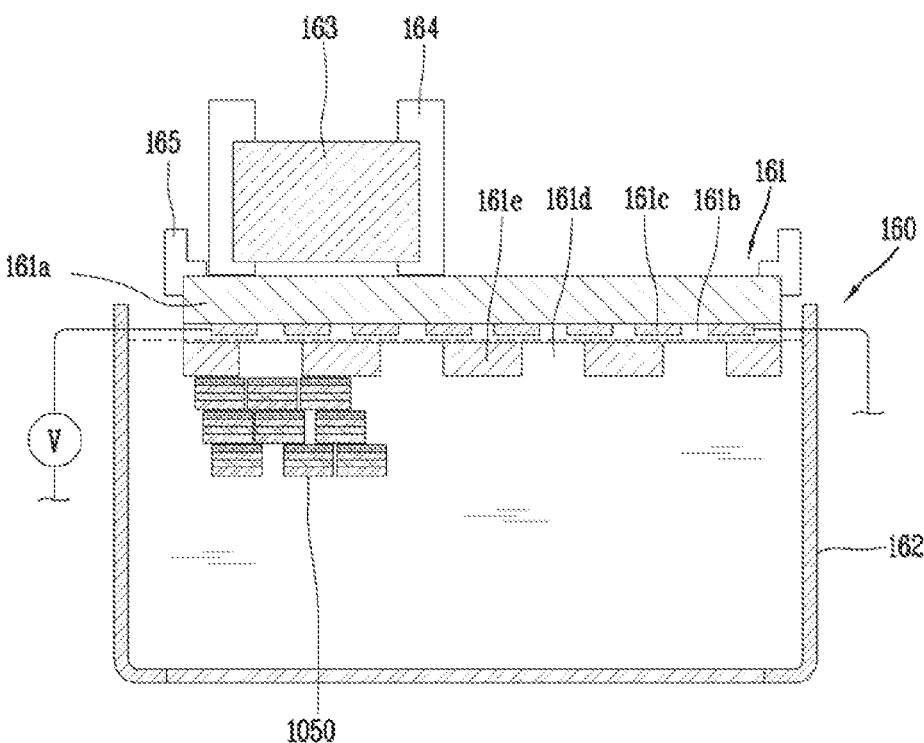
[Figure 8c]
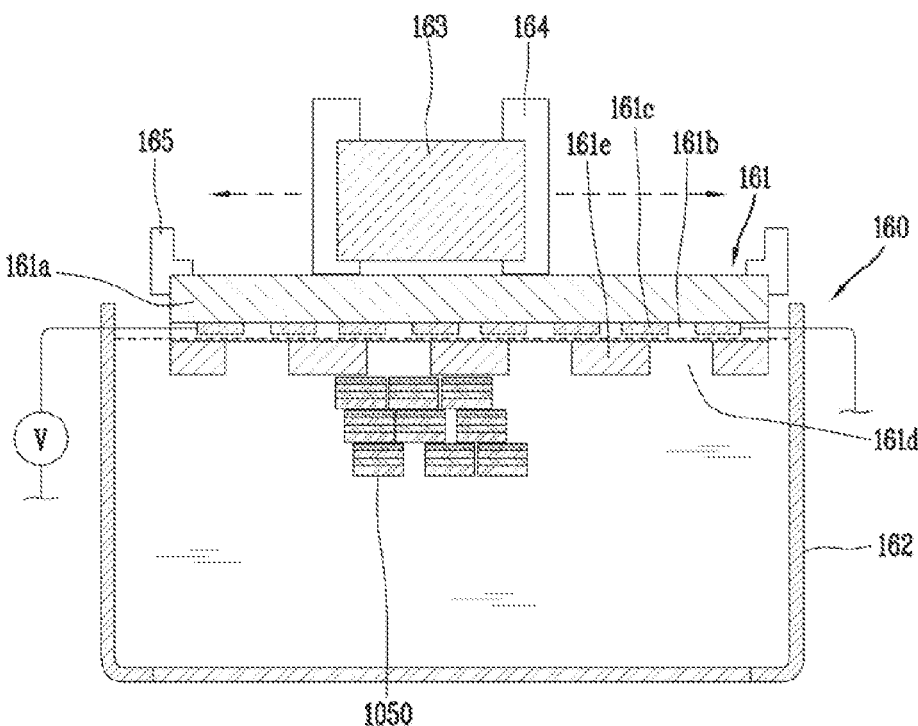

[Figure 8d]
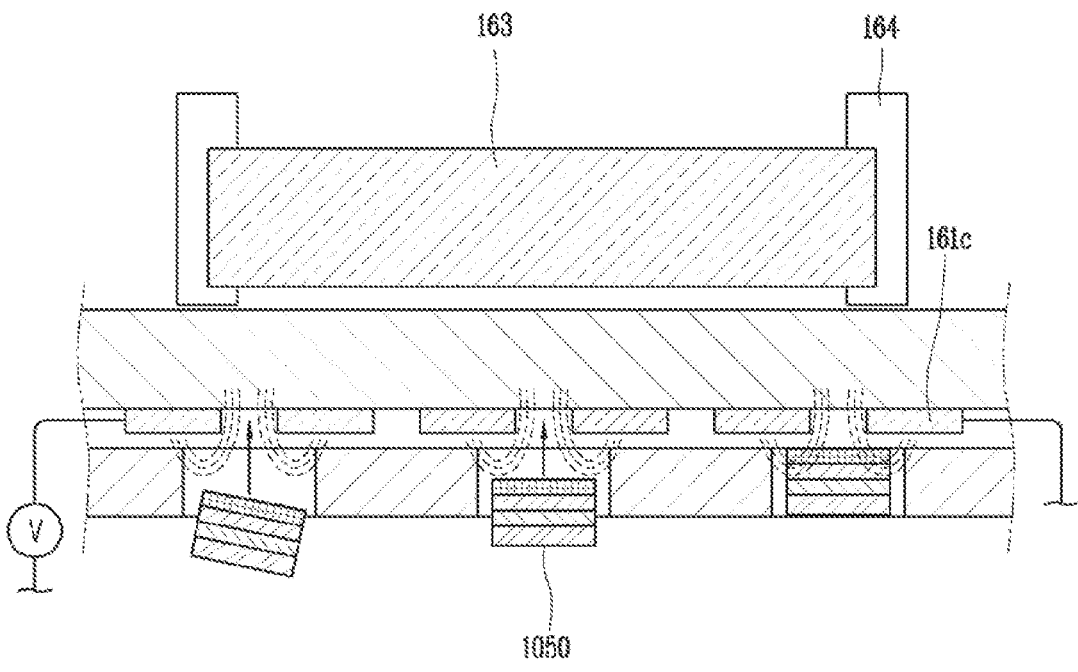
[Figure 8e]
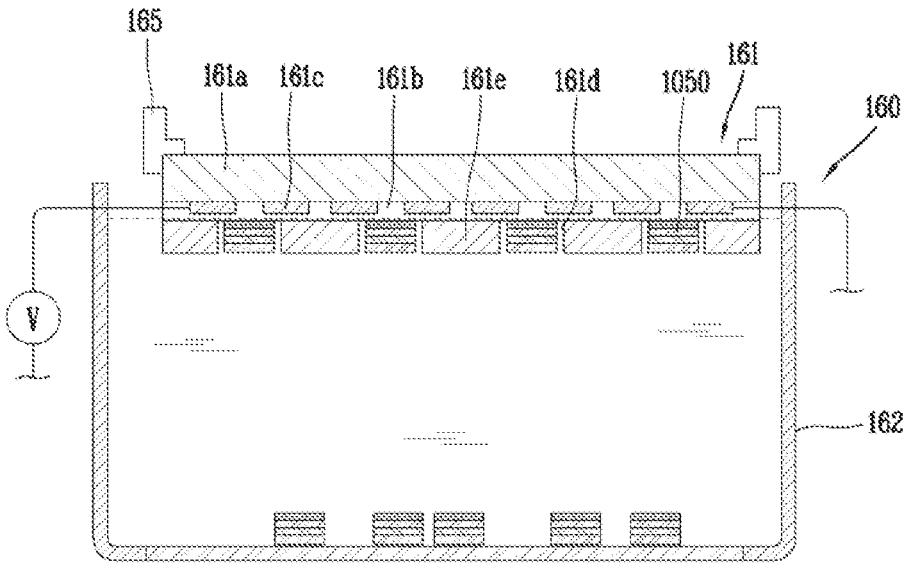

[Figure 9]
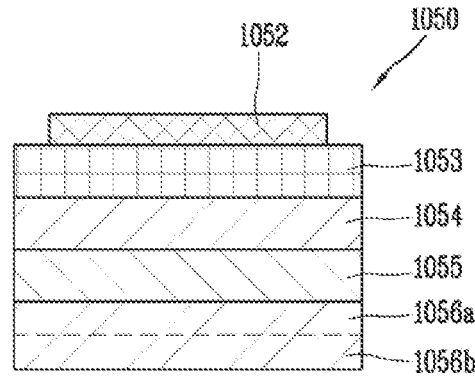
[Figure 10a]
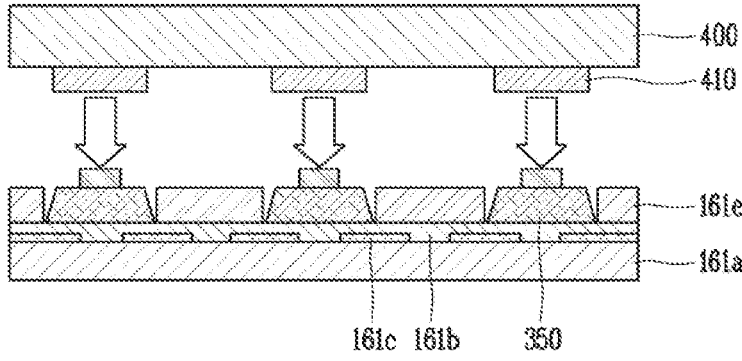
[Figure 10b]
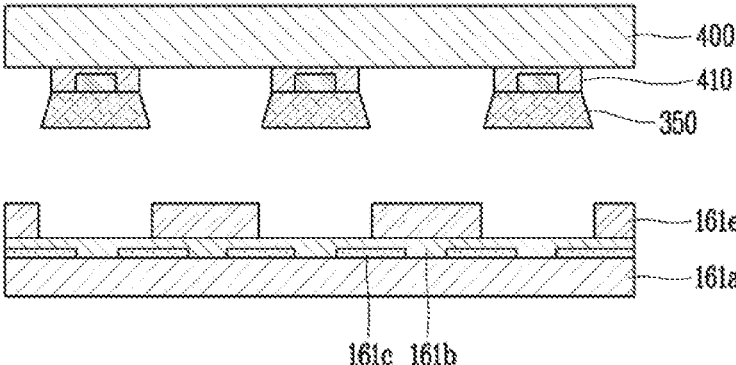

[Figure 10c]
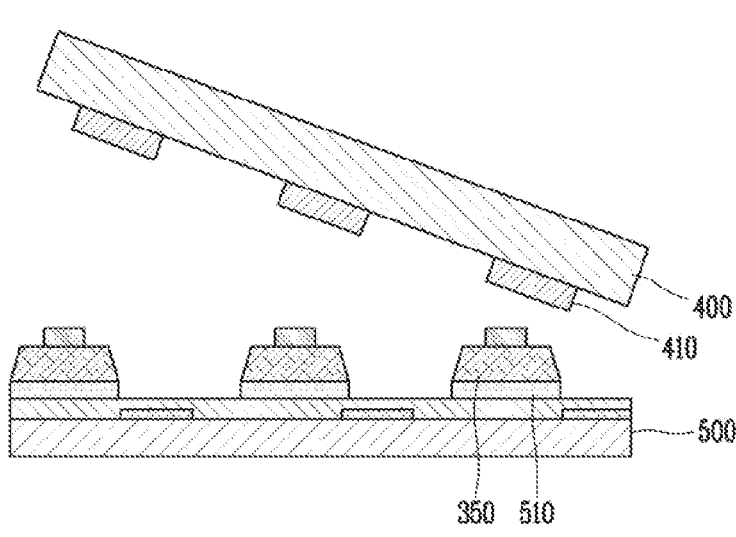
[Figure 11]
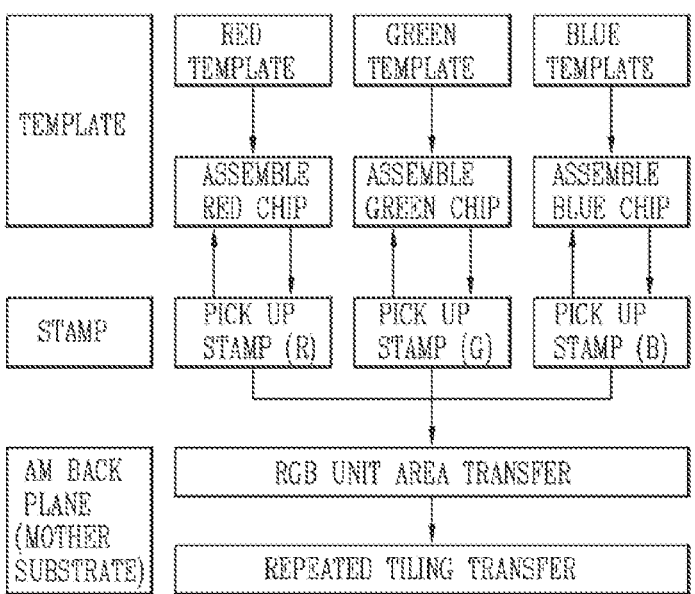

[Figure 12]
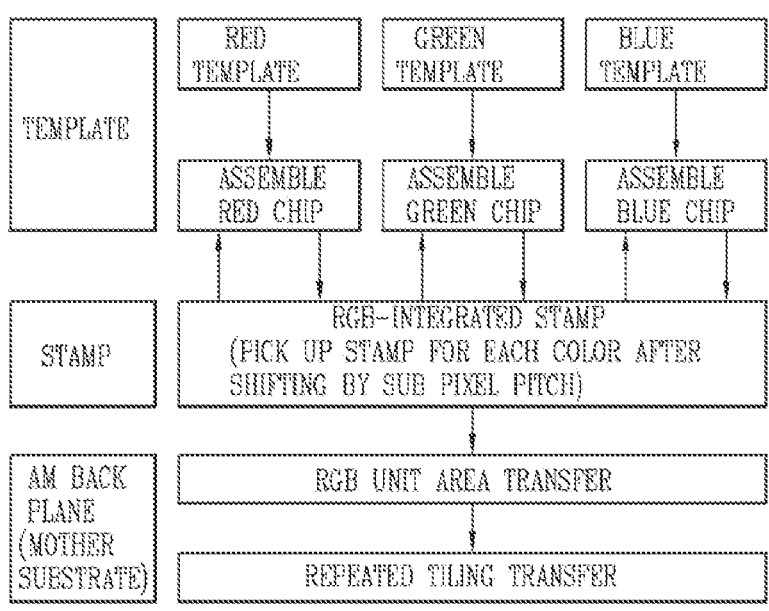
[Figure 13]
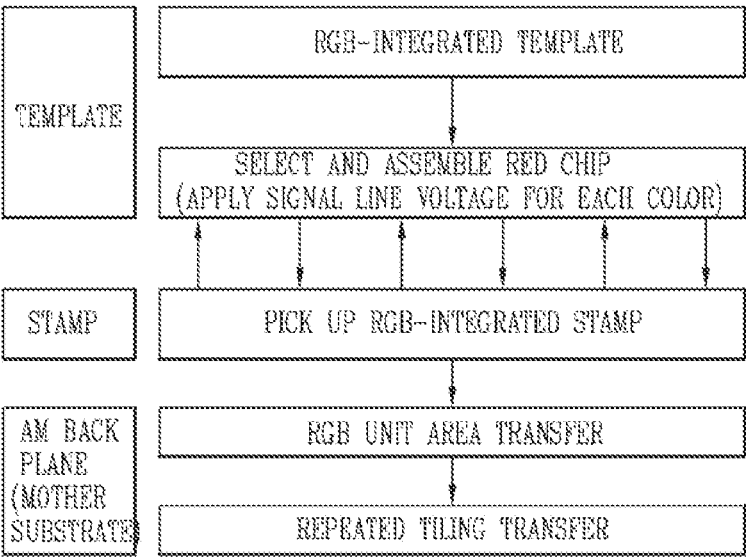

[Figure 14]
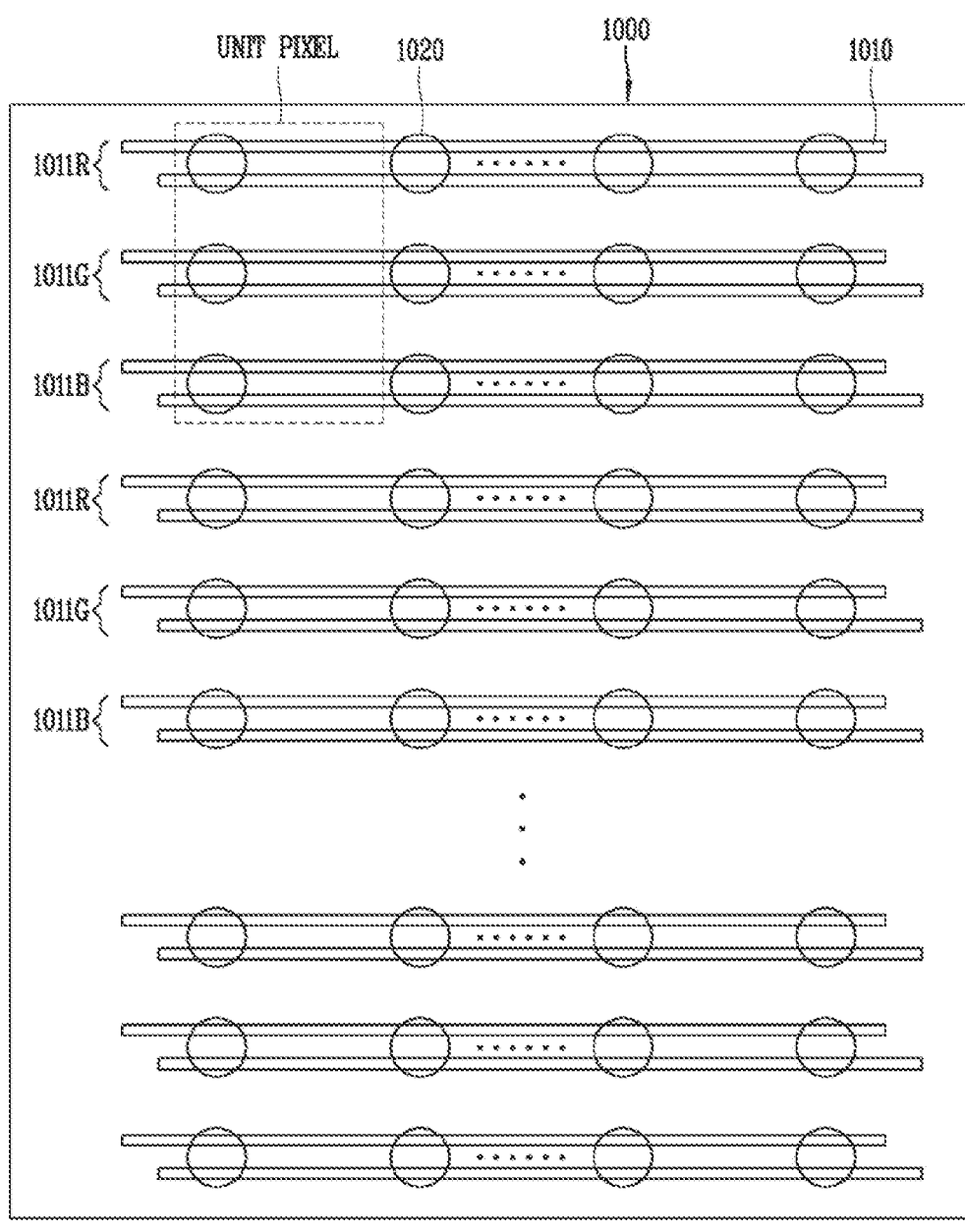

[Figure 15]
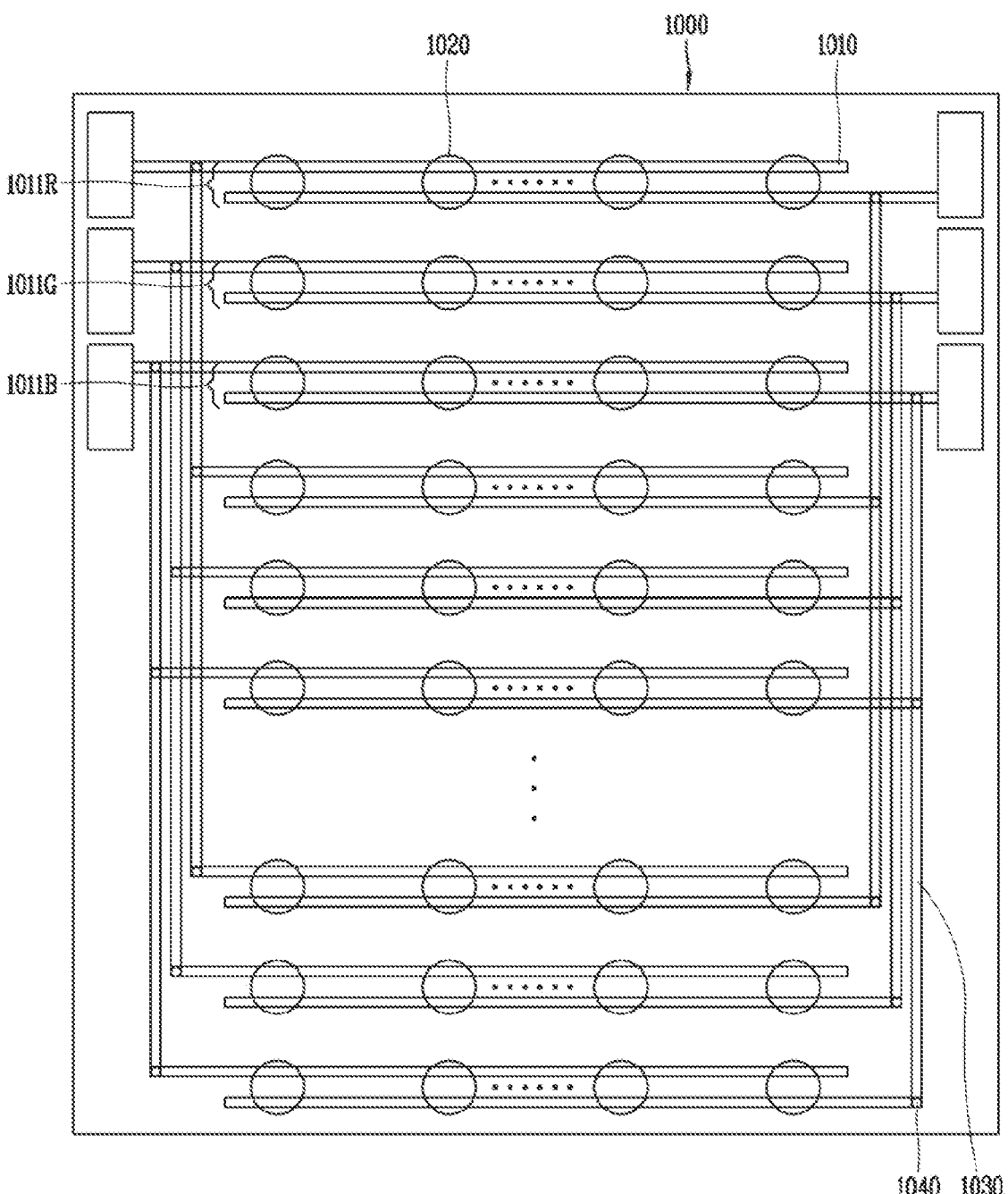

[Figure 16]
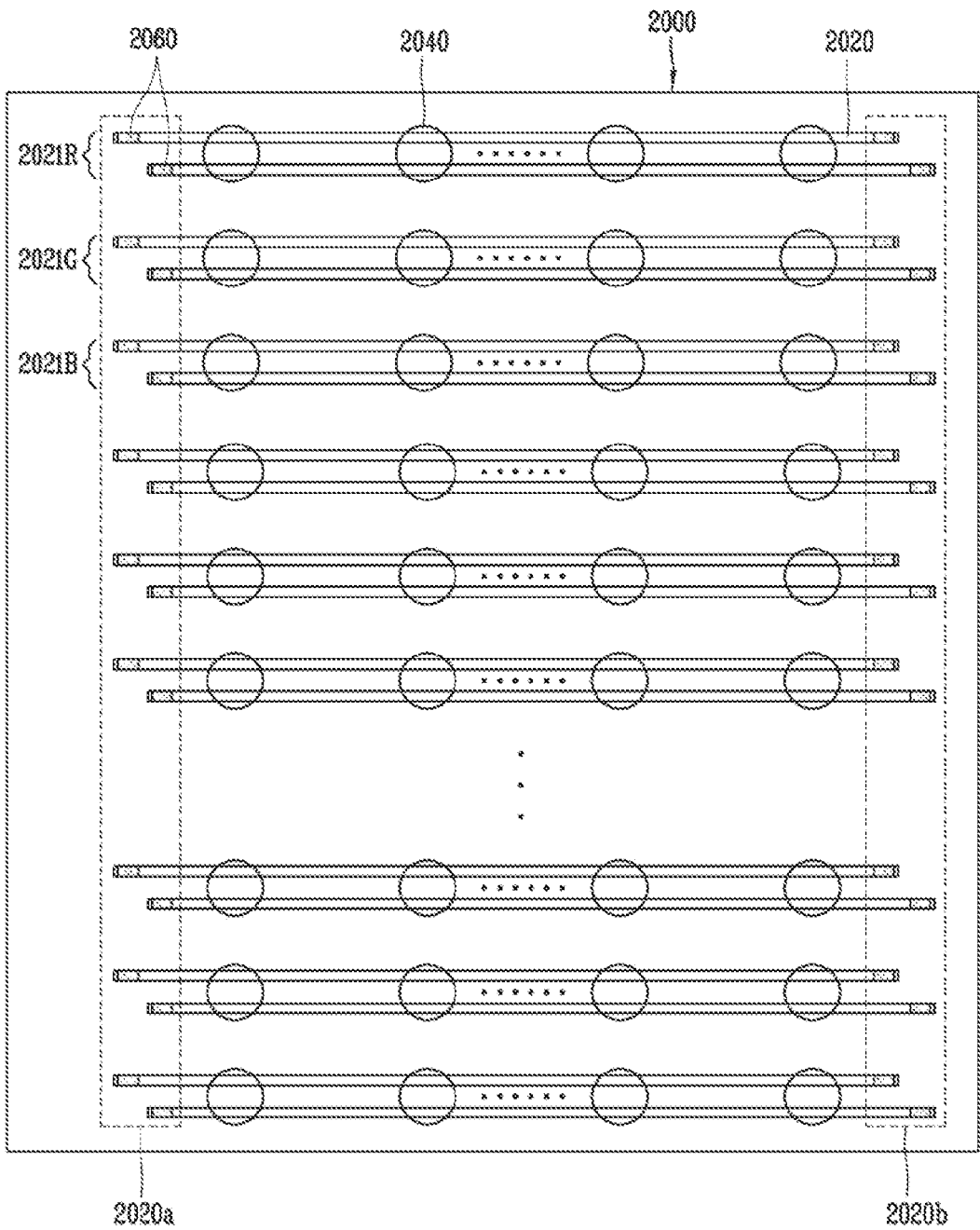

[Figure 17]
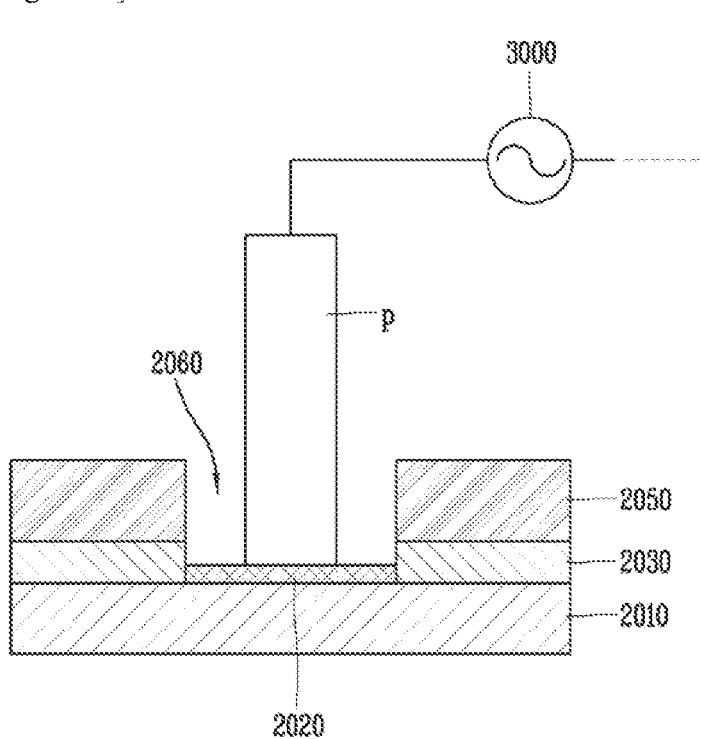

[Figure 18]
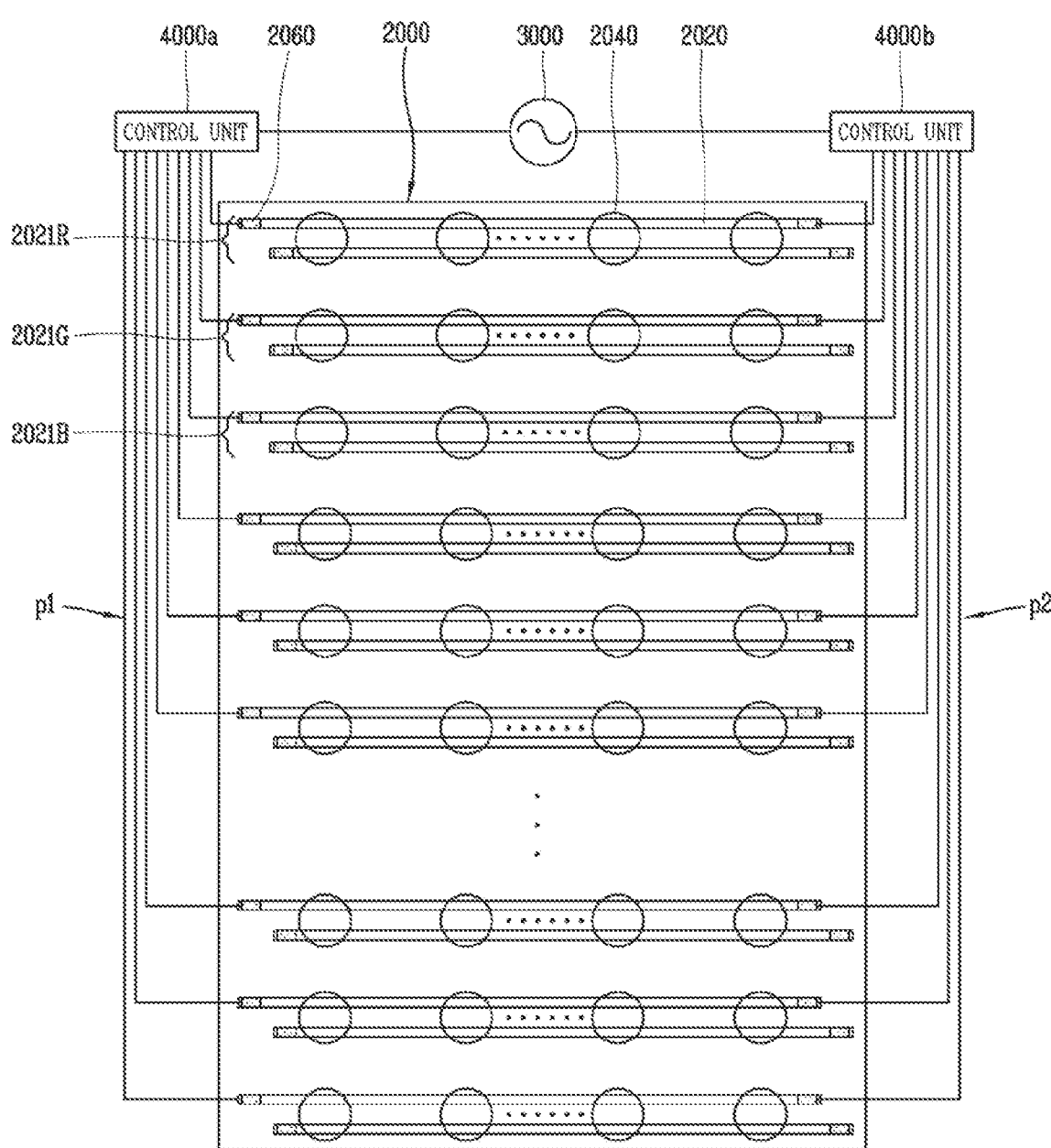

[Figure 19]

[Figure 20]
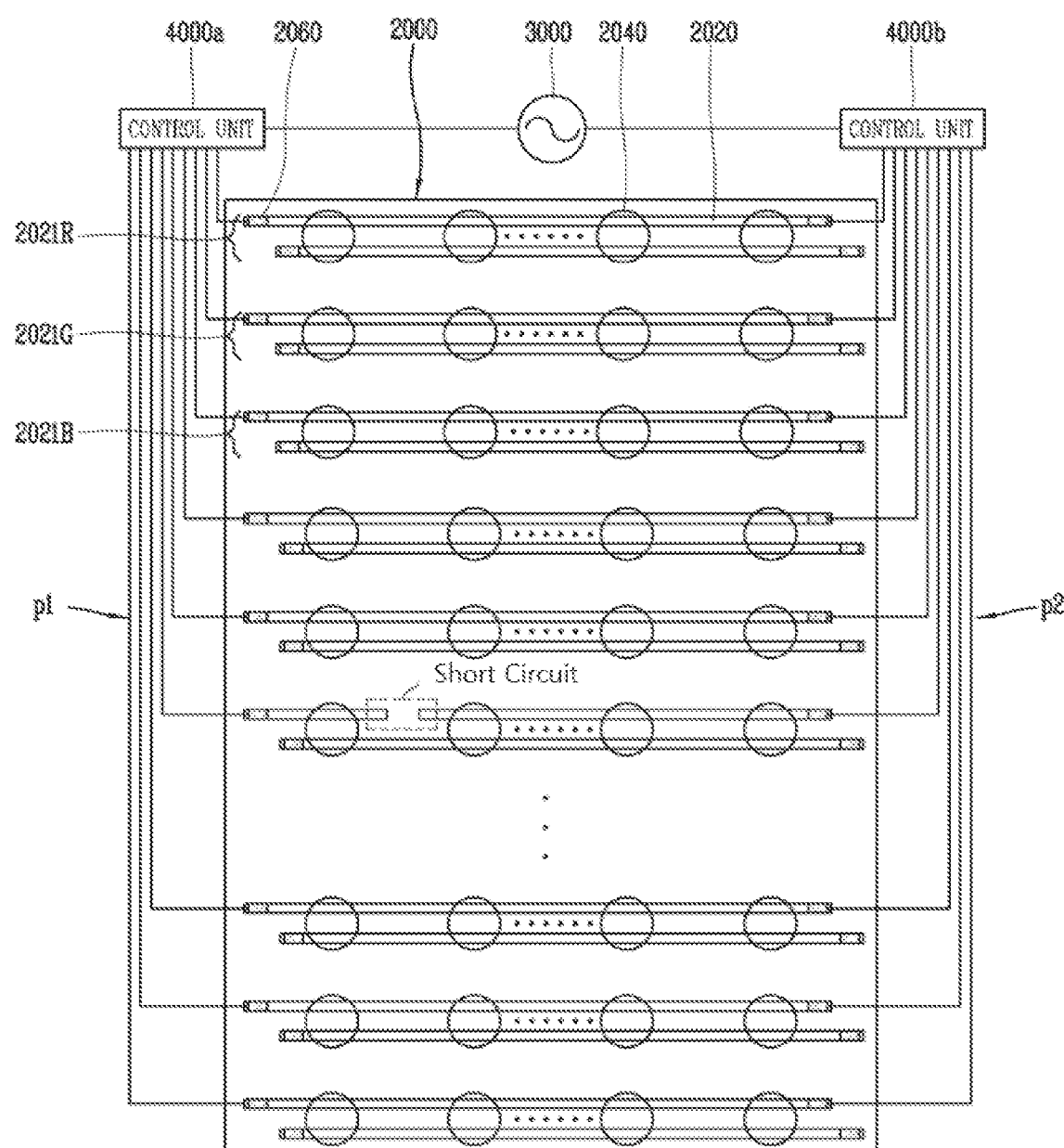

[Figure 21]
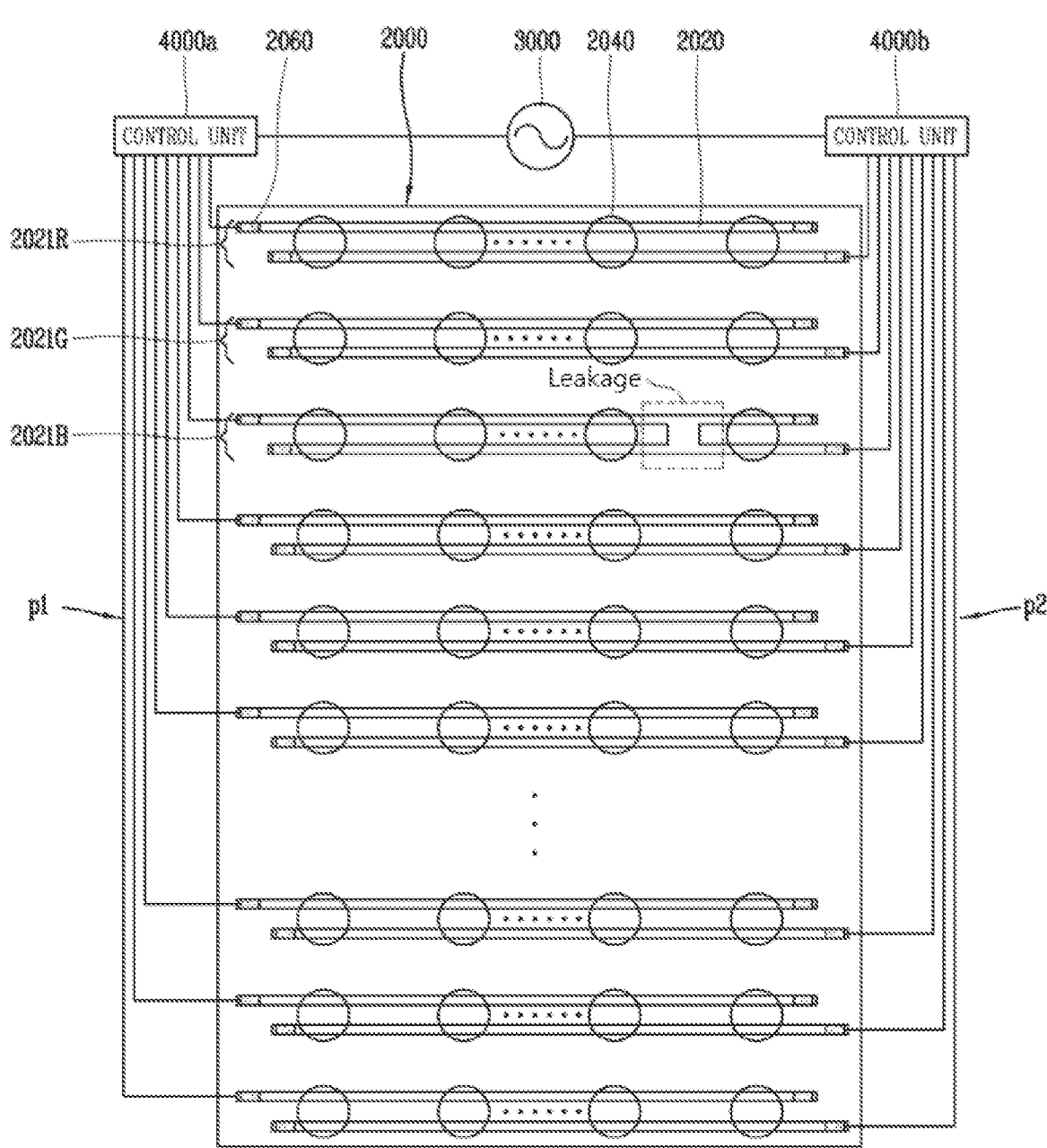

METHOD FOR MANUFACTURING A DISPLAY DEVICE USING A SEMICONDUCTOR LIGHT EMITTING DEVICE AND A SELF-ASSEMBLY APPARATUS USED THEREFOR

CROSS REFERENCE TO RELATED APPLICATIONS

This application is the National Stage filing under 35 U.S.C. 371 of International Application No. PCT/KR2019/016320, filed on Nov. 26, 2019, which claims the benefit of earlier filing date and right of priority to Korean Application No. 10-2019-0151577, filed on Nov. 22, 2019 in the Republic of Korea, the entire contents of all these applications being hereby expressly incorporated by reference into the present application.

TECHNICAL FIELD

The present invention relates to a method of manufacturing a display device using a semiconductor light emitting device having a size of several to several tens of μm, and a self-assembly apparatus used therefor.

BACKGROUND ART

Recently, liquid crystal displays (LCD), organic light emitting device (OLED) displays, and micro-LED displays are competing to implement large-area displays in the display technology field.

However, in the case of LCD, there are problems such as not fast response time and low efficiency of light generated by the backlight, and in the case of OLED, a short life, poor mass production yield, and low efficiency exist.

On the other hand, when a semiconductor light emitting device having a diameter or cross-sectional area of 100 μm or less (micro-LED) is used for a display, a very high efficiency can be provided because the display does not absorb light using a polarizing plate or the like. However, since a large display requires millions of semiconductor light emitting devices, it is difficult to transfer the devices compared to other technologies.

The technologies currently being developed for the transfer process include a pick and place method, a laser lift-off (LLO) method, or a self-assembly method. Among them, the self-assembly method is a method in which the semiconductor light emitting device finds its own position in a fluid, and is the most advantageous method for realizing a large-screen display device.

On the other hand, the self-assembly method, there is a method of directly assembling the semiconductor light emitting device on the final substrate (or wiring board) on which a wiring is formed, and a method of assembling the semiconductor light emitting device on an assembly substrate and transferring the semiconductor light emitting device to a final substrate through an additional transfer process.

Direct assembling to the final substrate is efficient in terms of process, and when using an assembly substrate, there is an advantage in that structures for self-assembly can be added without limitation, so the two methods are selectively used.

DISCLOSURE

Technical Problem

An object of the present invention is to provide a method of manufacturing a display device comprising semiconductor light emitting devices that emit red, green and blue light, in particular, an object of the present invention is to provide a self-assembly method capable of settling semiconductor light emitting devices emitting red, green, and blue light at preset positions on a substrate by individually applying voltages to the assembly electrodes.

Further, another object of the present invention is to provide a method of manufacturing a display device capable of detecting a defect of an assembly electrode during a self-assembly process.

Also, another object of the present invention is to provide a self-assembly apparatus used in the method of manufacturing such a display device.

Technical Solution

According to an embodiment of the present invention, a method of manufacturing a display device includes a step (a) put semiconductor light emitting devices including a magnetic material in a fluid chamber, a step (b) transferring a substrate extending in one direction and including assembly electrodes covered by an insulating layer and open holes exposing portions of both ends of the assembly electrodes to an assembly position; a step (c) applying a magnetic force to the semiconductor light emitting devices introduced into the fluid chamber so that the semiconductor light emitting devices move along one direction; and a step (d) forming an electric field so that the moving semiconductor light emitting devices are disposed at a preset position on the substrate. The step (d) is characterized in that the probe pin can be brought into contact with the assembly electrodes exposed through the open holes to individually apply a voltage to the assembly electrodes to form an electric field.

In this embodiment, the substrate can include: a base part on which the assembly electrodes are formed; an insulating layer stacked on the base part to cover the assembly electrodes; and a barrier wall disposed on the insulating layer while forming a cell on which the semiconductor light emitting device is disposed along an extension direction of the assembly electrode to overlap a part of the assembly electrode. It is characterized in that the open holes can be formed to pass through the insulating layer and the barrier wall.

In this embodiment, when assembling semiconductor light emitting devices that emit light of at least two different colors on the substrate, it is characterized in that after putting the semiconductor light emitting devices emitting a first color in the fluid chamber in step (a), the steps (b) to (d) are performed, after removing the remaining semiconductor light emitting devices emitting light of the first color remaining in the fluid chamber, again in step (a), semiconductor light emitting devices emitting a second color are introduced into the fluid chamber to perform steps (b) to (d).

In this embodiment, it is characterized in that the assembly electrodes can be divided into a plurality of groups according to the emission colors of the overlapping semiconductor light emitting devices, an electric field can be formed by applying voltages to different groups according to the colors emitted by the semiconductor light emitting devices injected into the fluid chamber.

In this embodiment, it is characterized in that the forming of the electric field can include forming and electric field by applying a voltage to the assembly electrodes corresponding to any one of the groups; and forming and electric field by applying a voltage to the assembly electrodes corresponding to the other group while maintaining the electric field formed by continuously applying a voltage to the assembly electrodes corresponding to the one group.

In this embodiment, it is characterized in that further including a step (e) contacting a probe pin to a portion of both ends of the assembly electrodes exposed through the open holes to measure the resistance values of the assembly electrodes to detect whether the assembly electrodes are defective, when the measured resistance value is not included in the preset resistance value range, it is determined that the assembly electrode is defective.

In this embodiment, it is characterized in that the probe pins can include a plurality of first probe pins provided on one end side of the assembly electrode and contacting one end portion of the assembly electrode; and a plurality of second probe pins provided on the other end side of the assembly electrode to contact the other end portion of the assembly electrode.

In this embodiment, it is characterized in that the step (e) can include measuring a resistance value between both ends of each of the assembly electrodes to detect whether the individual assembly electrodes are short-circuited.

In this embodiment, it is characterized in that the step of detecting whether the individual assembly electrodes are short-circuited can include a step of contacting the first probe pin with the assembly electrodes exposed through the open hole on one end side of at least one or more of the assembly electrodes; a step of contacting the second probe pin to the assembly electrodes exposed through the open hole on the other end side of the assembly electrodes in contact with the first probe pin; and a step of measuring a resistance value between the first probe pin and the second probe pin of the assembly electrodes to which the first probe pin and the second probe pin are in contact.

In this embodiment, it is characterized in that the step (e) can include step of detecting whether a short circuit occurs between the adjacent assembly electrodes by measuring a resistance value between one end portion or the other end portion of the first assembly electrode and the other end portion or one end portion of the second assembly electrode among the assembly electrodes.

In this embodiment, it is characterized in that the step of detecting whether a short circuit between the adjacent assembly electrodes can include a step of contacting the first probe pin with the assembly electrode exposed through the open hole on the one end side of the first assembly electrode or step of contacting the second probe pin to the assembly electrode exposed through the open hole on the other end side of the first assembly electrode; a step of contacting the second probe pin to the assembly electrode exposed through the open hole on the other end side of the second assembly electrode or step of contacting the first probe pin to the assembly electrode exposed through the open hole on the one end side of the second assembly electrode; and a step of measuring a resistance value between the first probe pin in contact with the first assembly electrode and the second probe pin in contact with the second assembly electrode or the second probe pin in contact with the first assembly electrode and the first probe pin in contact with the first assembly electrode.

In this embodiment, it is characterized that the self-assembly apparatus is formed extending along one direction, in the self-assembly apparatus for forming an electric field so that semiconductor light emitting devices are assembled on a substrate including assembly electrodes covered by an insulating layer and open holes exposing portions of both ends of the assembly electrodes, a power supply unit for generating a voltage signal; a control unit converting the generated voltage signal; and a probe pin for applying the converted voltage signal to the assembly electrodes are included, the probe pins respectively contact the assembly electrodes exposed through the open holes to apply a voltage to the assembly electrodes.

In this embodiment, it is characterized that the probe pins can include a plurality of first probe pins provided on one end side of the assembly electrode to contact one end portion of the assembly electrode; and a plurality of second probe pins provided on the other end side of the assembly electrode to contact the other end of the assembly electrode.

In this embodiment, it is characterized that the control unit can include a first control unit connected to the first probe pins; and a second control unit connected to the second probe pins, the first control unit and the second control unit independently convert the generated voltage signal.

Advantageous Effects

According to an embodiment of the present invention, a voltage can be applied by individually contacting a probe pin to each of the assembly electrodes through a structure in which both ends of the assembly electrodes formed on the substrate are exposed through an open hole, there is an effect that semiconductor light emitting devices emitting red, green, and blue light can be efficiently assembled on a substrate.

In particular, in manufacturing the substrate for self-assembly of semiconductor light emitting devices emitting red, green, and blue light, there is an effect of simplifying the manufacturing process and reducing the manufacturing cost.

In addition, there is effect that the probe pin can have a function of measuring the resistance of the assembly electrode, so that defects such as short circuits and short circuits of the assembly electrodes can be simply and easily detected in the assembling step.

DESCRIPTION OF DRAWINGS

FIG. 1 is a conceptual diagram illustrating an embodiment of a display device using a semiconductor light emitting device of the present invention.

FIG. 2 is a partially enlarged view of part A of the display device of FIG. 1.

FIG. 3 is an enlarged view of the semiconductor light emitting device of FIG. 2

FIG. 4 is an enlarged view showing another embodiment of the semiconductor light emitting device of FIG. 2.

FIGS. 5A to 5E are conceptual views for explaining a new process for manufacturing the above-described semiconductor light emitting device.

FIG. 6 is a conceptual diagram illustrating an example of an apparatus for self-assembly of a semiconductor light emitting device according to the present invention.

FIG. 7 is a block diagram of the self-assembly apparatus of FIG. 6.

FIGS. 8A to 8E are conceptual views illustrating a process of self-assembly a semiconductor light emitting device using the self-assembly apparatus of FIG. 6.

FIG. 9 is a conceptual diagram for explaining the semiconductor light emitting device of FIGS. 8A to 8E.

FIGS. 10A to 10C are conceptual views illustrating a state in which a semiconductor light emitting device is transferred after the self-assembly process according to the present invention.

FIGS. 11 to 13 are flowcharts illustrating a method of manufacturing a display device including a semiconductor light emitting device that emits red (R), green (G), and blue (B) light.

FIG. 14 is a view showing the structure of a related art substrate on which assembly electrodes are formed.

FIG. 15 is a view showing a connection structure for applying a voltage between the assembly electrodes formed on a related art substrate.

FIG. 16 is a view showing the structure of a substrate on which assembly electrodes are formed according to an embodiment of the present invention.

FIG. 17 is a view showing a state in which a probe pin is in contact with an assembly electrode through an open hole of the substrate shown in FIG. 16

FIG. 18 is a conceptual diagram showing a voltage application method to the assembly electrodes according to an embodiment of the present invention.

FIG. 19 is a graph showing a voltage signal applied to each assembly electrode when assembling RGB according to an embodiment of the present invention.

FIG. 20 is a conceptual diagram illustrating a method of detecting whether or not the assembly electrodes are short-circuited according to an embodiment of the present invention.

FIG. 21 is a conceptual diagram illustrating a method of detecting whether a short circuit exists between adjacent assembly electrodes according to an embodiment of the present invention.

MODE FOR INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, in describing the embodiments disclosed in the present specification, if it is determined that detailed descriptions of related known technologies can obscure the gist of the embodiments disclosed in the present specification, the detailed description thereof will be omitted. In addition, the accompanying drawings are only for easy understanding of the embodiments disclosed in the present specification, and should not be construed as limiting the technical idea disclosed herein by the accompanying drawings. When an element such as a layer, region or substrate is referred to as being "on" another component, it will be understood that this can be directly on other elements or intervening elements can exist in between.

The display device described in this specification can include a mobile phone, a smart phone, a laptop computer, terminals for digital broadcasting, a PDA (personal digital assistants), a PMP (portable multimedia player), a navigation, a Slate PC, a Tablet PC, a Ultrabook, a Digital TV, a Desktop Computer, etc. However, the configuration according to the embodiment described in the present specification can be applied to a display capable device even if it is a new product form to be developed later.

FIG. 1 is a conceptual diagram showing an embodiment of a display device using a semiconductor light emitting device of the present invention. FIG. 2 is a partially enlarged view of part A of the display device of FIG. 1, FIG. 3 is an enlarged view of the semiconductor light emitting device of FIG. 2, and FIG. 4 is an enlarged view showing another embodiment of the semiconductor light emitting device of FIG. 2.

As shown, information processed by the control unit of the display apparatus 100 can be output from the display module 140. A closed-loop case 101 surrounding an edge of the display module can form a bezel of the display device.

The display module 140 can include a panel 141 on which an image is displayed, the panel 141 can include a micro-sized semiconductor light emitting device 150 and a wiring board 110 on which the semiconductor light emitting device 150 is mounted.

A wiring can be formed on the wiring board 110 to be connected to the n-type electrode 152 and the p-type electrode 156 of the semiconductor light emitting device 150. Through this, the semiconductor light emitting device 150 can be provided on the wiring board 110 as an individual pixel that emits light.

The image displayed on the panel 141 is visual information, and is implemented by independently controlling light emission of sub-pixels arranged in a matrix form through the wiring.

In the present invention, a micro-LED (Light Emitting Diode) is exemplified as a type of the semiconductor light emitting device 150 that converts current into light. The micro-LED can be a light emitting diode formed in a small size of 100 micrometers or less. In the semiconductor light emitting device 150, blue, red, and green colors are respectively provided in the light emitting region, and a unit pixel can be implemented by a combination thereof. That is, the unit pixel means a minimum unit for implementing one color, and at least three micro-LEDs can be provided in the unit pixel.

More specifically, referring to FIG. 3, the semiconductor light emitting device 150 can have a vertical structure.

For example, the semiconductor light-emitting device 150 can be implemented as a high-output light-emitting device that emits various types of light, including blue, by mainly using gallium nitride (GaN) and adding indium (In) and/or aluminum (Al) together.

Such a vertical semiconductor light emitting device can include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the lower p-type electrode 156 can be electrically connected to the p-electrode of the wiring board, and the upper n-type electrode 152 can be electrically connected to the n-electrode at the upper side of the semiconductor light emitting device. The vertical semiconductor light emitting device 150 has a great advantage in that it is possible to reduce the chip size because electrodes can be arranged up and down.

As another example, referring to FIG. 4, the semiconductor light emitting device can be a flip chip type light emitting device.

As an example, the semiconductor light emitting device 250 can include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 can be electrically connected to the p-electrode and the n-electrode of the wiring board under the semiconductor light emitting device.

The vertical semiconductor light emitting device and the horizontal semiconductor light emitting device can be a green semiconductor light emitting device, a blue semiconductor light emitting device, or a red semiconductor light emitting device, respectively. In the case of a green semiconductor light emitting device and a blue semiconductor light emitting device, gallium nitride (GaN) is mainly used, and indium (In) and/or aluminum (Al) are added together, so that it can be implemented as a high-output light emitting device emitting green or blue light. For this example, the semiconductor light emitting device can be a gallium nitride thin film formed in various layers such as n-Gan, p-Gan, AlGaN, InGan, etc. Specifically, the p-type semiconductor layer can be P-type GaN, and the n-type semiconductor layer can be N-type GaN. However, in the case of a red semiconductor light emitting device, the p-type semiconductor layer can be P-type GaAs, and the n-type semiconductor layer can be N-type GaAs.

Also, the p-type semiconductor layer can be P-type GaN doped with Mg on the p-electrode side, and the n-type semiconductor layer can be N-type GaN doped with Si on the n-electrode side. In this case, the above-described semiconductor light emitting devices can be semiconductor light emitting devices without an active layer.

On the other hand, referring to FIGS. 1 to 4, since the light emitting diode can be very small, in the display panel, self-luminous unit pixels can be arranged in a high definition, through this, a high-definition display device can be implemented.

In the display device using the semiconductor light emitting device of the present invention described above, the semiconductor light emitting device grown on a wafer and formed through mesa and isolation can be used as an individual pixel. In this case, the micro-sized semiconductor light emitting device 150 should be transferred to a predetermined position on the substrate of the display panel on the wafer. There is a pick and place method as such a transfer technology, but the success rate is low and a lot of time is required. As another example, there is a technique of transferring several devices at once using a stamp or a roll, but there is a limit to the yield, which is not suitable for a large screen display. The present invention proposes a new manufacturing method and manufacturing apparatus of a display device that can solve these problems.

To this end, hereinafter, a new method of manufacturing a display device will be described. FIGS. 5A to 5E are conceptual views for explaining a new process of manufacturing the above-described semiconductor light emitting device.

In this specification, a display device using a passive matrix (PM) type semiconductor light emitting device is exemplified. However, the examples described below are also applicable to an active matrix (AM) type semiconductor light emitting device. In addition, although a method of self-assembly a horizontal semiconductor light emitting device is exemplified, it is also applicable to a method of self-assembly a vertical semiconductor light emitting device.

First, according to the manufacturing method, the first conductivity type semiconductor layer 153, the active layer 154, and the second conductivity type semiconductor layer 155 are grown on the growth substrate 159, respectively (refer to FIG. 5A).

When the first conductivity type semiconductor layer 153 is grown, next, an active layer 154 can be grown on the first conductivity type semiconductor layer 153, next, a second conductivity type semiconductor layer 155 can be grown on the active layer 154. In this way, when the first conductivity type semiconductor layer 153, the active layer 154, and the second conductivity type semiconductor layer 155 can be sequentially grown, as shown in FIG. 5A, the first conductivity type semiconductor layer 153, the active layer 154, and the second conductivity type semiconductor layer 155 can form a stacked structure.

In this case, the first conductivity type semiconductor layer 153 can be a p-type semiconductor layer, and the second conductivity type semiconductor layer 155 can be an n-type semiconductor layer. However, the present invention is not necessarily limited thereto, and examples in which the first conductivity type can be n-type and the second conductivity type can be p-type are also possible.

In addition, although the case in which the active layer is present is exemplified in this embodiment, a structure without the active layer is possible in some cases as described above. For this example, the p-type semiconductor layer can be P-type GaN doped with Mg, and the n-type semiconductor layer can be N-type GaN doped with Si on the n-electrode side.

The growth substrate 159 (wafer) can be formed of a material having a light-transmitting property, for example, any one of sapphire ($Al_2O_3$), GaN, ZnO, and AlO, but is not limited thereto. In addition, the growth substrate 1059 can be formed of a material suitable for semiconductor material growth, a carrier wafer. Also, it can be formed of a material with excellent thermal conductivity, including a conductive substrate or an insulating substrate, for example, at least one of Si, GaAs, GaP, InP, $Ga_2O_3$ or a SiC substrate having higher thermal conductivity than a sapphire ($Al_2O_3$) substrate can be used.

Next, at least some of the first conductivity type semiconductor layer 153, the active layer 154, and the second conductivity type semiconductor layer 155 are removed to form a plurality of semiconductor light emitting devices (refer to FIG. 5B).

More specifically, isolation is performed so that a plurality of light emitting devices can form a light emitting device array. That is, the first conductivity type semiconductor layer 153, the active layer 154, and the second conductivity type semiconductor layer 155 can be vertically etched to form a plurality of semiconductor light emitting devices.

If a horizontal semiconductor light emitting device is formed, the active layer 154 and the second conductivity type semiconductor layer 155 are partially removed in the vertical direction, a mesa process in which the first conductivity type semiconductor layer 153 is exposed to the outside, and an isolation process in which the first conductivity type semiconductor layer is etched to form a plurality of semiconductor light emitting device arrays can be performed thereafter.

Next, second conductive electrodes 156 (or p-type electrodes) are respectively formed on one surface of the second conductivity type semiconductor layer 155 (refer to FIG. 5C). The second conductive electrode 156 can be formed by a deposition method such as sputtering, but the present invention is not limited thereto. However, when the first conductivity type semiconductor layer and the second conductivity type semiconductor layer are an n-type semiconductor layer and a p-type semiconductor layer, respectively, the second conductive electrode 156 can be an n-type electrode.

Next, the growth substrate 159 is removed to provide a plurality of semiconductor light emitting devices. For example, the growth substrate 1059 can be removed using a laser lift-off (LLO) method or a chemical lift-off (CLO) method (refer to FIG. 5D).

Thereafter, a step of settling the semiconductor light emitting devices 150 on a substrate in a chamber filled with a fluid is performed (refer to FIG. 5E).

For example, the semiconductor light emitting devices 150 and the substrate are put in a chamber filled with a fluid, and the semiconductor light emitting devices are self-assembled on the substrate 1061 using flow, gravity, surface tension, and the like. In this case, the substrate can be the assembly substrate 161.

As another example, it is also possible to put a wiring board in a fluid chamber instead of the assembly board 161 so that the semiconductor light emitting devices 150 are directly disposed on the wiring board. In this case, the substrate can be a wiring substrate. However, for convenience of description, in the present invention, the substrate is provided as the assembly substrate 161 to exemplify that the semiconductor light emitting devices 1050 are mounted.

Cells (not shown) in which the semiconductor light emitting devices 150 are inserted can be provided in the assembly substrate 161 to facilitate mounting of the semiconductor light emitting devices 150 on the assembly substrate 161. Specifically, cells in which the semiconductor light emitting devices 150 are disposed are formed on the assembly substrate 161 at positions where the semiconductor light emitting devices 150 are aligned with the wiring electrodes. The semiconductor light emitting devices 150 are assembled to the cells while moving in the fluid.

After arranging a plurality of semiconductor light emitting devices on the assembly substrate 161, if the semiconductor light emitting devices of the assembly substrate 161 are transferred to a wiring board, large-area transfer is possible. Accordingly, the assembly substrate 161 can be referred to as a temporary substrate.

On the other hand, in order to apply the self-assembly method described above to the manufacture of a large-screen display, it is necessary to increase the transfer yield. The present invention proposes a method and apparatus for minimizing the influence of gravity or frictional force and preventing non-specific binding in order to increase the transfer yield.

In this case, in the display device according to the present invention, a magnetic material can be disposed on a semiconductor light emitting device to move the semiconductor light emitting device using magnetic force, and the semiconductor light emitting device is disposed at a preset position by using an electric field during the movement process. Hereinafter, such a transfer method and apparatus will be described in more detail with the accompanying drawings.

FIG. 6 is a conceptual diagram illustrating an example of a self-assembly apparatus for a semiconductor light emitting device according to the present invention, and FIG. 7 is a block diagram of the self-assembly apparatus of FIG. 6. FIGS. 8A to 8D are conceptual views illustrating a process of self-assembly a semiconductor light emitting device using the self-assembly apparatus of FIG. 6, and FIG. 9 is a conceptual diagram for explaining the semiconductor light emitting device of FIGS. 8A to 8D.

Referring to FIGS. 6 and 7, the self-assembly apparatus 160 of the present invention can include a fluid chamber 162, a magnet 163, and a position control unit 164.

The fluid chamber 162 can have a space for accommodating a plurality of semiconductor light emitting devices. The space can be filled with a fluid, and the fluid can include water as an assembly solution. Accordingly, the fluid chamber 162 can be a water tank and can be configured as an open type. However, the present invention is not limited thereto, and the fluid chamber 162 can be of a closed type in which the space is a closed space.

In the fluid chamber 162, the substrate 161 can be disposed such that an assembly surface on which the semiconductor light emitting devices 150 are assembled faces downward. For example, the substrate 161 can be transferred to an assembly position by a transfer unit, and the transfer unit can include a stage 165 on which the substrate is mounted. The position of the stage 165 can be adjusted by the controller, and through this, the substrate 161 can be transferred to the assembly position.

At this time, the assembly surface of the substrate 161 can face the bottom of the fluid chamber 150 in the assembly position. As shown, the assembly surface of the substrate 161 can be arranged to be immersed in the fluid in the fluid chamber 162. Accordingly, the semiconductor light emitting device 150 can move to the assembly surface in the fluid.

The substrate 161 can be an assembly substrate capable of forming the electric field, and can include a base part 161a, a dielectric layer 161b, and a plurality of electrodes 161c.

The base part 161a can be made of an insulating material, and the plurality of electrodes 161c can be thin film or thick film bi-planar electrodes patterned on one surface of the base part 161a. The electrode 161c can be formed of, for example, a stack of Ti/Cu/Ti, Ag paste, ITO, or the like.

The dielectric layer 161b can be made of an inorganic material such as $SiO_2$, SiNx, SiON, $Al_2O_3$, $TiO_2$, $HfO_2$, or the like. Alternatively, the dielectric layer 161b can be formed of a single layer or a multi-layer as an organic insulator. The thickness of the dielectric layer 161b can be in the range of several tens of nm to several μm.

Furthermore, the substrate 161 according to the present invention can include a plurality of cells 161d partitioned by barrier wall. The cells 161d can be sequentially arranged in one direction and can be made of a polymer material. Also, the barrier wall 161e forming the cells 161d can be shared with the neighboring cells 161d. The barrier wall 161e can protrude from the base part 161a, and the cells 161d can be sequentially disposed along one direction by the barrier wall 161e. More specifically, the cells 161d can be sequentially arranged in the column and row directions, respectively, and can have a matrix structure.

Inside the cells 161d, as shown, a groove for accommodating the semiconductor light emitting device 150 is provided, and the groove can be a space defined by the barrier wall 161e. The shape of the groove can be the same as or similar to that of the semiconductor light emitting device. For example, when the semiconductor light emitting device has a rectangular shape, the groove can have a rectangular shape. Also, although not shown, when the semiconductor light emitting device has a circular shape, the grooves formed in the cells can have a circular shape. Furthermore, each of the cells is configured to accommodate a single semiconductor light emitting device. That is, one semiconductor light emitting device is accommodated in one cell.

Meanwhile, the plurality of electrodes 161c can include a plurality of electrode lines disposed at the bottom of each of the cells 161d, and the plurality of electrode lines can extend to adjacent cells.

The plurality of electrodes 161c can be disposed below the cells 161d, and different polarities are applied to each other to generate an electric field in the cells 161d. To form the electric field, the dielectric layer can form the bottom of the cells 161d while covering the plurality of electrodes 161c with the dielectric layer. In this structure, when different polarities are applied to the pair of electrodes 161c under each of the cells 161d, an electric field can be formed, and the semiconductor light emitting device can be inserted into the cells 161d by the electric field.

In the assembly position, the electrodes of the substrate 161 are electrically connected to the power supply unit 171. The power supply unit 171 applies power to the plurality of electrodes to generate the electric field.

As shown, the self-assembly apparatus can include a magnet 163 for applying a magnetic force to the semiconductor light emitting devices. The magnet 163 can be spaced apart from the fluid chamber 162 to apply a magnetic force to the semiconductor light emitting devices 150. The magnet 163 can be disposed to face the opposite surface of the assembly surface of the substrate 161, and the position of the magnet is controlled by the position controller 164 connected to the magnet 163.

The semiconductor light emitting device 1050 can include a magnetic material to move in the fluid by the magnetic field of the magnet 163.

Referring to FIG. 9, in a semiconductor light emitting device including a magnetic material can include a first conductive electrode 1052 and a second conductive electrode 1056, a first conductivity type semiconductor layer 1053 on which the first conductive electrode 1052 is disposed, a second conductivity type semiconductor layer 1055 overlapping the first conductivity type semiconductor layer 1052 and on which the second conductive electrode 1056 is disposed, and an active layer 1054 disposed between the first and second conductivity type semiconductor layers 1053 and 1055.

Here, the first conductivity type can be a p-type, and the second conductivity type can be configured as an n-type, and vice versa. In addition, as described above, it can be a semiconductor light emitting device without the active layer.

Meanwhile, in the present invention, the first conductive electrode 1052 can be generated after the semiconductor light emitting device is assembled on the wiring board by self-assembly of the semiconductor light emitting device. Also, in the present invention, the second conductive electrode 1056 can include the magnetic material. The magnetic material can mean a magnetic metal. The magnetic material can be Ni, SmCo, or the like, and as another example, can include a material corresponding to at least one of Gd-based, La-based, or Mn-based materials.

The magnetic material can be provided on the second conductive electrode 1056 in the form of particles. Alternatively, in a conductive electrode including a magnetic material, one layer of the conductive electrode can be formed of a magnetic material. For this example, as shown in FIG. 9, the second conductive electrode 1056 of the semiconductor light emitting device 1050 can include a first layer 1056a and a second layer 1056b. Here, the first layer 1056a can include a magnetic material, and the second layer 1056b can include a metal material rather than a magnetic material.

As shown, in this example, the first layer 1056a including a magnetic material can be disposed to contact the second conductivity type semiconductor layer 1055. In this case, the first layer 1056a is disposed between the second layer 1056b and the second conductivity type semiconductor layer 1055. The second layer 1056b can be a contact metal connected to the second electrode of the wiring board. However, the present invention is not necessarily limited thereto, and the magnetic material can be disposed on one surface of the first conductivity type semiconductor layer.

Referring back to FIGS. 6 and 7, more specifically, the self-assembly apparatus can include a magnet handler capable of automatically or manually moving the x, y, and z axes on the upper portion of the fluid chamber, or a motor capable of rotating the magnet 163. The magnet handler and the motor can constitute the position control unit 164. Through this, the magnet 163 can rotate in a horizontal direction, clockwise or counterclockwise direction with the substrate 161.

Meanwhile, a light-transmitting bottom plate 166 can be formed in the fluid chamber 162, and the semiconductor light emitting devices can be disposed between the bottom plate 166 and the substrate 161. An image sensor 167 can be disposed to face the bottom plate 166 to monitor the inside of the fluid chamber 162 through the bottom plate 166. The image sensor 167 is controlled by the controller 172 and can include an inverted type lens and a CCD to observe the assembly surface of the substrate 161.

The self-assembly apparatus described above is made to use a combination of a magnetic field and an electric field. Using this, the semiconductor light emitting devices can be mounted at a predetermined position on the substrate by the electric field while the semiconductor light emitting devices can be moved by a change in the position of the magnet. Hereinafter, the assembly process using the self-assembly apparatus described above will be described in more detail.

First, a plurality of semiconductor light emitting devices 1050 including a magnetic material are formed through the process described with reference to FIGS. 5A to 5C. In this case, in the process of forming the second conductive electrode of FIG. 5C, a magnetic material can be deposited on the semiconductor light emitting device.

Next, the substrate 161 is transferred to the assembly position, and the semiconductor light emitting devices 1050 are put into the fluid chamber 162 (FIG. 8A).

As described above, the assembly position of the substrate 161 can be a position in which the assembly surface of the substrate 161 on which the semiconductor light emitting devices 1050 are assembled faces downward in the fluid chamber 162.

In this case, some of the semiconductor light emitting devices 1050 can sink to the bottom of the fluid chamber 162 and some can float in the fluid. When the light-transmitting bottom plate 166 is provided in the fluid chamber 162, some of the semiconductor light emitting devices 1050 can sink to the bottom plate 166.

Next, a magnetic force is applied to the semiconductor light emitting devices 1050 so that the semiconductor light emitting devices 1050 vertically float in the fluid chamber 162 (refer to FIG. 8B).

When the magnet 163 of the self-assembly apparatus moves from its original position to the opposite surface of the assembly surface of the substrate 161, the semiconductor light emitting devices 1050 are raised in the fluid toward the substrate 161. The original position can be a position deviated from the fluid chamber 162. As another example, the magnet 163 can be configured as an electromagnet. In this case, electricity is supplied to the electromagnet to generate an initial magnetic force.

Meanwhile, in this example, if the magnitude of the magnetic force is adjusted, the separation distance between the assembly surface of the substrate 161 and the semiconductor light emitting devices 1050 can be controlled. For example, the separation distance can be controlled using the weight, buoyancy, and magnetic force of the semiconductor light emitting devices 1050. The separation distance can be several millimeters to several tens of micrometers from the outermost surface of the substrate.

Next, a magnetic force is applied to the semiconductor light emitting devices 1050 so that the semiconductor light emitting devices 1050 move in one direction in the fluid chamber 162. For example, the magnet 163 moves in a direction parallel to the substrate, clockwise or counter-clockwise (refer to FIG. 8C). In this case, the semiconductor light emitting devices 1050 move in a direction parallel to the substrate 161 at a position spaced apart from the substrate 161 by the magnetic force.

Next, in the process of moving the semiconductor light emitting devices 1050, a step of inducing the semiconductor light emitting devices 1050 to the predetermined position by applying an electric field so as to be disposed at a predetermined position of the substrate 161 is performed (refer to FIG. 8C). For example, while the semiconductor light emitting devices 1050 are moving in a direction horizontal to the substrate 161, and move in a direction perpendicular to the substrate 161 by the electric field and are disposed at a predetermined position on the substrate 161.

More specifically, a power can be supplied to the bi-planar electrode of the substrate 161 to generate an electric field, and by using this, assembly can be induced only at a preset position. That is, by using the selectively generated electric field, the semiconductor light emitting devices 1050 can be self-assembled at the assembly position of the substrate 161. To this end, cells in which the semiconductor light emitting devices 1050 are inserted can be provided on the substrate 161.

Thereafter, the unloading process of the substrate 161 proceeds, and the assembly process is completed. When the substrate 161 is an assembly substrate, a post-process for realizing a display device by transferring the semiconductor light emitting devices arranged as described above to a wiring board can be performed.

Meanwhile, after guiding the semiconductor light emitting devices 1050 to the preset position, the magnet 163 can be moved in a direction away from the substrate 161 so that the semiconductor light emitting devices 1050 remaining in the fluid chamber 162 fall to the bottom of the fluid chamber (referrer to FIG. 8D). As another example, when power supply is stopped when the magnet 163 is an electromagnet, the semiconductor light emitting devices 1050 remaining in the fluid chamber 162 fall to the bottom of the fluid chamber 162.

Thereafter, when the semiconductor light emitting devices 1050 at the bottom of the fluid chamber 162 are recovered, the recovered semiconductor light emitting devices 1050 can be reused.

In order to increase assembly yield in fluidic assembly, the self-assembly apparatus and method described can use a magnetic field to focus distant components near a preset assembly site, and can apply a separate electric field to the assembly site to selectively assemble components only at the assembly site. At this time, the assembly board can be placed on the upper part of the water tank and the assembly surface can be directed downward to minimize the effect of gravity due to the weight of the parts and prevent non-specific binding to eliminate defects. That is, to increase the transfer yield, the assembly substrate can be placed on the upper part to minimize the influence of gravity or frictional force, and non-specific binding can be prevented.

As described above, according to the present invention having the above configuration, in a display device in which individual pixels are formed of semiconductor light emitting devices, a large number of semiconductor light emitting devices can be assembled at once.

As described above, according to the present invention, it is possible to pixelate a large amount of semiconductor light emitting devices on a small-sized wafer and then transfer them to a large-area substrate. Through this, it is possible to manufacture a large-area display device at a low cost.

Meanwhile, the present invention can provide a structure and method of an assembly substrate for increasing the yield of the above-described self-assembly process and the process yield after self-assembly. The present invention can be limited when the substrate 161 can be used as an assembly substrate. That is, the assembly board, which will be described later, cannot be used as a wiring board of the display device. Accordingly, the substrate 161 will be referred to as an assembly substrate 161 hereinafter.

The present invention can improve the process yield from two viewpoints. First, according to the present invention, an electric field is strongly formed at an unwanted position, and thus the semiconductor light emitting device can be prevented from being disposed at an unwanted position. Second, the present invention can prevent the semiconductor light emitting devices from remaining on the assembly substrate when transferring the semiconductor light emitting devices disposed on the assembly substrate to another substrate.

The above-described problems cannot be individually achieved by different components. The two solutions described above can be achieved by organically combining the components to be described later and the assembly substrate 161 described above.

Before describing the present invention in detail, a post-process for manufacturing a display device after self-assembly will be described.

FIGS. 10A to 10C are conceptual views illustrating a state in which a semiconductor light emitting device is transferred after the self-assembly process according to the present invention.

When the self-assembly process described with reference to FIGS. 8A to 8E is completed, the semiconductor light emitting devices are disposed at a preset position of the assembly substrate 161. The semiconductor light emitting devices disposed on the assembly substrate 161 are transferred to another substrate at least once. In this specification, an embodiment in which the semiconductor light emitting devices disposed on the assembly substrate 161 are transferred twice is described, but the present invention is not limited thereto. The semiconductor light emitting devices disposed on the assembly substrate 161 can be transferred to another substrate once or three or more times.

Meanwhile, immediately after the self-assembly process is completed, the assembly surface of the assembly substrate 161 is in a state facing downward direction (or in the direction of gravity). For the self-assembly process, the assembly substrate 161 can be turned 180 degrees in a state in which the semiconductor light emitting device is disposed. In this process, since there is a risk that the semiconductor light emitting device is separated from the assembly substrate 161, a voltage is to be applied to the plurality of electrodes 161c (hereinafter assembly electrodes) while the assembly substrate 161 is turned over. The electric field formed between the assembly electrodes can prevent the semiconductor light emitting device from being separated from the assembly substrate 161 while the assembly substrate 161 is turned over.

If the assembly substrate 161 is turned over 180 degrees after the self-assembly process, the shape is as shown in FIG. 10A. Specifically, as shown in FIG. 10A, the assembly surface of the assembly substrate 161 is in a state facing upward (or in a direction opposite to gravity). In this state, the transfer substrate 400 can be aligned above the assembly substrate 161.

The transfer substrate 400 can be a substrate for transferring the semiconductor light emitting devices disposed on the assembly substrate 161 to the wiring board by separating. The transfer substrate 400 can be formed of a polydimethylsiloxane (PDMS) material. Accordingly, the transfer substrate 400 can be referred to as a PDMS substrate.

The transfer substrate 400 can be pressed to the assembly substrate 161 after being aligned with the assembly substrate (161). Then, when the transfer substrate 400 is transferred to the upper side of the assembly substrate 161, due to the adhesive force of the transfer substrate 400, the semiconductor light emitting devices 350 disposed on the assembly substrate 161 can move to the transfer substrate.

To this end, the surface energy between the semiconductor light emitting device 350 and the transfer substrate 400 should be higher than the surface energy between the semiconductor light emitting device 350 and the dielectric layer 161b. As the difference between the surface energy between the semiconductor light emitting device 350 and the transfer substrate 400 and the surface energy between the semiconductor light emitting device 350 and the dielectric layer 161b increases, the probability that the semiconductor light emitting device 350 is separated from the assembly substrate 161 increases, it is preferable that the difference between the two surface energies is greater.

On the other hand, when pressing the transfer substrate 400 to the assembly substrate 161, the transfer substrate 400 can include a plurality of protrusions 410 so that the pressure applied by the transfer substrate 400 can be concentrated on the semiconductor light emitting device 350. The protrusions 410 can be formed at the same spacing as the semiconductor light emitting devices disposed on the assembly substrate 161. After aligning the protrusions 410 to overlap the semiconductor light emitting devices 350, when the transfer substrate 400 is pressed against the assembly substrate 161, the pressure applied by the transfer substrate 400 can be concentrated only on the semiconductor light emitting devices 350. Through this, the present invention can increase the probability that the semiconductor light emitting device is separated from the assembly substrate 161.

On the other hand, in a state in which the semiconductor light emitting devices are disposed on the assembly substrate 161, a portion of the semiconductor light emitting devices is preferably exposed to the outside of the groove. When the semiconductor light emitting devices 350 are not exposed to the outside of the groove, since the pressure of the transfer substrate 400 cannot be concentrated on the semiconductor light emitting devices 350, the probability that the semiconductor light emitting device 350 is separated from the assembly substrate 161 can be reduced.

Finally, referring to FIG. 10c, a step of transferring the semiconductor light emitting devices 350 from the transfer substrate 400 to the wiring substrate 500 is performed by pressing the transfer substrate 400 to the wiring substrate 500. In this case, a protrusion 510 can be formed on the wiring board 500. The transfer substrate 400 and the wiring substrate 500 can be aligned so that the semiconductor light emitting devices 350 disposed on the transfer substrate 400 and the protrusion 510 overlap. Thereafter, when the transfer substrate 400 and the wiring substrate 500 can be compressed, the probability that the semiconductor light emitting devices 350 are separated from the transfer substrate 400 can increase due to the protrusion 510.

Meanwhile, in order for the semiconductor light emitting devices 350 disposed on the transfer substrate 400 to be transferred to the wiring substrate 500, the surface energy between the semiconductor light emitting device 350 and the wiring board 500 should be higher than the surface energy between the semiconductor light emitting device 350 and the transfer substrate 400. As the difference between the surface energy between the semiconductor light emitting device 350 and the wiring board 500 and the surface energy between the semiconductor light emitting device 350 and the transfer substrate 400 increases, the probability that the semiconductor light emitting device 350 is separated from the transfer substrate 400 can increase, so it is preferable that the difference between the two surface energies is greater.

After transferring all of the semiconductor light emitting devices 350 disposed on the transfer board 400 to the wiring board 500, a step of forming an electrical connection between the semiconductor light emitting devices 350 and a wiring electrode formed on a wiring substrate can be performed. The structure of the wiring electrode and the method of forming the electrical connection can vary depending on the type of the semiconductor light emitting device 350.

Meanwhile, although not shown, an anisotropic conductive film can be disposed on the wiring board 500. In this case, an electrical connection can be formed between the semiconductor light emitting devices 350 and the wiring electrodes formed on the wiring board 500 only by pressing the transfer substrate 400 and the wiring board 500.

Meanwhile, in the case of manufacturing a display device including semiconductor light emitting devices emitting light of different colors, the method described with reference to FIGS. 10A to 10C can be implemented in various ways. Hereinafter, a method of manufacturing a display device including a semiconductor light emitting device that emits red (R), green (G), and blue (B) light will be described.

FIGS. 11 to 13 are flowcharts illustrating a method of manufacturing a display device including a semiconductor light emitting device that emits red (R), green (G), and blue (B) light.

The semiconductor light emitting devices emitting light of different colors can be individually assembled on different assembly substrates. Specifically, the assembly substrate 161 can include a first assembly substrate on which semiconductor light emitting devices emitting a first color are disposed, a second assembly substrate on which semiconductor light emitting devices emitting a second color different from the first color are disposed, and a third assembly substrate on which semiconductor light emitting devices emitting a third color different from the first and second colors are disposed. Different types of semiconductor light emitting devices are assembled on each assembly substrate according to the method described with reference to FIGS. 8A to 8E. For example, each of the semiconductor light emitting devices emitting red (R), green (G), and blue (B) light can be assembled on each of the first to third assembly substrates.

Referring to FIG. 11, each of the RED chip, the GREEN chip, and the BLUE chip can be assembled on each of the first to third assembly substrates (RED TEMPLATE, GREEN TEMPLATE, and BLUE TEMPLATE). In this state, each of the RED chip, the green chip, and the BLUE chip can be transferred to the wiring board by different transfer boards.

Specifically, the step of transferring the semiconductor light emitting devices disposed on the assembly board to the wiring board can include transferring the semiconductor light emitting devices (RED chips) emitting the first color from the first assembly substrate (RED TEMPLATE) to the first transfer substrate (stamp (R)) by pressing the first transfer substrate (stamp (R)) on the first assembly substrate (RED TEMPLATE), transferring the semiconductor light emitting devices (GREEN chips) emitting the second color from the second assembly substrate (GREEN TEMPLATE) to the second transfer substrate (stamp (G)) by pressing the second transfer substrate (stamp (G)) on the second assembly substrate (GREEN TEMPLATE), and transferring the semiconductor light emitting devices (BLUE chips) emitting the third color from the third assembly substrate (BLUE TEMPLATE) to the third transfer substrate (stamp (B)) by pressing the third transfer substrate (stamp (B)) on the third assembly substrate (BLUE TEMPLATE), Then, by pressing each of the first to third transfer substrates to the wiring board, a step of transferring the semiconductor light emitting devices emitting light of the first to third colors from each of the first to third transfer substrates to the wiring board is performed.

According to the manufacturing method of FIG. 11, three types of assembly substrates and three types of transfer substrates are required to manufacture a display device including a RED chip, a GREEN chip, and a BLUE chip.

Alternatively, referring to FIG. 12, each of the RED chip, the GREEN chip, and the BLUE chip can be assembled on each of the first to third assembly substrates (RED TEMPLATE, GREEN TEMPLATE, and BLUE TEMPLATE). In this state, each of the RED chip, the GREEN chip, and the BLUE chip can be transferred to the wiring board by the same transfer board.

Specifically, the step of transferring the semiconductor light emitting devices disposed on the assembly board to the wiring board can include transferring the semiconductor light emitting devices (RED chips) emitting the first color from the first assembly substrate (RED TEMPLATE) to a first transfer substrate (RGB integrated stamp) by pressing the transfer substrate (RGB integrated stamp) on the first assembly substrate (RED TEMPLATE), transferring the semiconductor light emitting devices (GREEN chips) emitting the second color from the second assembly substrate (GREEN TEMPLATE) to the transfer substrate (RGB integrated stamp) by pressing the transfer substrate (RGB integrated stamp) on the second assembly substrate (GREEN TEMPLATE), and transferring the semiconductor light emitting devices (BLUE chips) emitting the third color from the third assembly substrate (BLUE TEMPLATE) to the transfer substrate (RGB integrated stamp) by pressing the transfer substrate (RGB integrated stamp) on the third assembly substrate (BLUE TEMPLATE), In this case, alignment positions between each of the first to third assembly substrates and the transfer substrate can be different from each other. For example, when alignment between the assembly substrate and the transfer substrate is completed, the relative position of the transfer substrate with respect to the first assembly substrate and the relative position of the transfer substrate with respect to the second assembly substrate can be different from each other. The transfer substrate can shift the alignment position by the PITCH of the SUB PIXEL whenever the type of assembly substrate is changed. In this way, when the transfer substrate is sequentially pressed to the first to third assembly substrates, all three types of chips can be transferred to the transfer substrate.

After that, as in FIG. 11, the transfer substrate can be pressed to the wiring substrate, and the semiconductor light emitting devices emitting light of the first to third colors are transferred from the transfer substrate to the wiring substrate.

According to the manufacturing method of FIG. 12, three types of assembly substrates and one type of transfer substrate are required to manufacture a display device including a RED chip, a GREEN chip, and a BLUE chip.

Unlike the above-described FIGS. 11 and 12, according to FIG. 13, each of the RED chip, the GREEN chip, and the BLUE chip can be assembled on one assembly board (RGB integrated TEMPLATE). In this state, each of the RED chip, the GREEN chip, and the BLUE chip can be transferred to the wiring board by the same transfer board (RGB integrated stamp).

According to the manufacturing method of FIG. 13, one type of assembly substrate and one type of transfer substrate are required to manufacture a display device including a RED chip, a GREEN chip, and a BLUE chip.

As described above, when manufacturing a display device including semiconductor light emitting devices that emit light of different colors, the manufacturing method can be implemented in various ways.

The present invention relates to a method of manufacturing a display device comprising semiconductor light emitting devices that emit red, green and blue light using self-assembly, it is characterized in that a voltage can be applied individually or selectively to the assembly electrodes using a probe pin.

In the present invention, the substrate on which the semiconductor light emitting devices are assembled can be an assembly substrate or a wiring substrate, and in this specification, the substrate can mean to both an assembly substrate and a wiring substrate.

First, a problem that occurs when assembling red, green, and blue semiconductor light emitting devices on a related art assembly board or wiring board will be described with reference to FIGS. 14 and 15.

FIG. 14 is a diagram showing the structure of a related art substrate on which assembly electrodes are formed, and FIG. 15 is a diagram illustrating a connection structure for voltage application between assembly electrodes formed on a related art substrate.

As described above, the self-assembly method is a method in which the semiconductor light emitting devices 1050 are dispersed in a fluid and then assembled on the substrate 1000 using a magnetic field and an electric field. Accordingly, the substrate 1000 used in the self-assembly method should include assembly electrodes 1010 for forming an electric field as shown in FIG. 14. Here, the substrate used in the self-assembly method means to a substrate on which the semiconductor light emitting devices 1050 are directly mounted through self-assembly, and does not correspond to a substrate on which the semiconductor light emitting devices 1050 are mounted by transfer or the like.

The assembly electrodes 1010 can form an electric field on one surface of the substrate 1000 as a voltage is applied, the semiconductor light emitting devices 1050 can be guided to one surface of the substrate 1000 by an electric field to be disposed in the cell 1020.

Specifically, two adjacent assembly electrodes 1010 can form one pair electrode 1011, voltages of different polarities can be applied to each assembly electrode 1010 forming the pair electrode 1011 to form an electric field. The cell 1020 in which the semiconductor light emitting device 1050 is disposed can be formed to overlap the assembly electrodes 1010 forming the pair electrode 1011 at the same time.

If, when assembling the semiconductor light emitting devices 1050 that emit red, green, and blue light on the substrate 1000, the lines 1011R, 1011G, and 1011B on which the semiconductor light emitting devices emitting red light, semiconductor light emitting devices emitting green light, and semiconductor light emitting devices emitting blue light are assembled can be sequentially repeated as shown in FIG. 14.

On the other hand, according to the structure of the related art substrate 1000, the assembly electrodes 1010 to which voltages of the same polarity are applied are connected from one end of the substrate 1000 through a bus line 1030, accordingly, a voltage was simultaneously applied to all the assembly electrodes 1010 connected through the bus line 1030.

If, when assembling the semiconductor light emitting devices 1050 that emit red, green, and blue light on the substrate 1000, as shown in FIG. 15, the bus line can be connected between assembly electrodes to which a voltage of the same polarity is applied among the lines 1011R on which the semiconductor light emitting devices emitting red light are assembled. The bus line can be connected between assembly electrodes to which a voltage of the same polarity is applied among the lines 1011G on which the semiconductor light emitting devices emitting green light are assembled. And the bus line can be connected between assembly electrodes to which a voltage of the same polarity is applied among the lines 1011B on which the semiconductor light emitting devices emitting blue light are assembled. In this case, the assembly electrodes 1010 and the bus lines 1030 are formed on different insulating layers to prevent a short circuit and then electrically connected through the via hole 1040.

However, in this structure, when a short occurs between the adjacent assembly electrodes 1010 at any one point, there is a problem in that the semiconductor light emitting devices 1050 are not assembled over the entire area of the substrate 1000 due to leakage of the entire substrate 1000.

In addition, additional processes had to be necessarily added when manufacturing the substrate 1000. In particular, the masking process increases at least twice by patterning the assembly electrodes 1010 and the bus line 1030 on different insulating layers, and the expensive photolithography process is increased at least twice with the addition of the masking process for forming the via hole 1040, so there is a problem in that the manufacturing cost of the substrate 1000 is rapidly increased.

The method of manufacturing a display device according to an embodiment of the present invention is to solve the above-described problem.

FIG. 16 is a view showing the structure of a substrate on which assembly electrodes are formed according to an embodiment of the present invention, and FIG. 17 is a view illustrating a state in which a probe pin is in contact with an assembly electrode through an open hole of the substrate shown in FIG. 16.

Hereinafter, a method of manufacturing a display device according to an embodiment of the present invention will be described.

The method of manufacturing a display device according to an embodiment of the present invention is distinguished from the related art self-assembly method in the structure of the substrate 2000 and the electric field application method.

First, in the same manner as in the related art self-assembly method (a), the step of inserting the semiconductor light emitting devices 1050 having a magnetic material into the fluid chamber can be performed.

Next, the step (b) of transferring the substrate 2000 to the assembly position can be performed. In this case, the substrate 2000 can include the assembly electrodes 2020 formed to extend in one direction, and the assembly location can be an open upper part of the fluid chamber, and one surface of the substrate 2000 on which the semiconductor light emitting devices 1050 are assembled can be disposed to face the bottom surface of the fluid chamber.

According to an embodiment of the present invention, the substrate 2000 can have the following structure.

The substrate 2000 can include a base part 2010 on which the assembly electrodes 2020 are formed, an insulating layer 2030 stacked on the base part 2010 to cover the assembly electrodes 202, and a barrier wall 2050 stacked on the insulating layer 2030 while forming a cell 2040 on which the semiconductor light emitting device 1050 is disposed along the extension direction of the assembly electrode 2020 so as to overlap a portion of the assembly electrode 2020. Since the above structures are the same as those of the related art substrate 1000, a detailed description thereof will be omitted.

According to an embodiment of the present invention, the assembly electrodes 2020 included in the substrate 2000 can be separated from each other, and can include an open hole 2060 exposing a portion of both ends of the assembly electrodes 2020.

According to an embodiment of the present invention, the assembly electrodes 2020 can be electrically separated through a structure separated from each other, and an electrical signal can be individually applied through a portion exposed through the open hole 2060.

The open hole 2060 can be formed to penetrate the insulating layer 2030 and the barrier wall 2050 overlapping a portion of both ends of each of the assembly electrodes 2020. For example, the open hole 2060 can be formed through masking and etching.

According to an embodiment of the present invention, since two photolithography processes, which are added to fabricate the structure of the substrate 1000 for implementing the related art RGB, can be reduced to one, the manufacturing process can be simplified and the manufacturing cost can be reduced.

Next, the step (c) applying a magnetic force to the semiconductor light emitting devices 1050 introduced into the fluid chamber can be performed so that the semiconductor light emitting devices 1050 move in one direction. The magnetic force can be formed by a magnet array disposed on the other side of the substrate 2000.

Next, the step (d) forming an electric field so that the semiconductor light emitting devices 1050 can be disposed in a preset position of the substrate 2000, that is, the cell 2040 can be performed. An electric field can be formed by applying a voltage to the assembly electrodes 2020.

According to an embodiment of the present invention, an electric field can be formed by individually applying a voltage to the assembly electrodes 2020 by contacting the probe pin p shown in FIG. 16 to at least one side of a portion of both ends of the assembly electrode 2020 exposed through the open hole 2060.

For example, the assembly electrode 2020*a* of any one of the two assembly electrodes 2020 forming the pair electrode 2021 can contact the probe pin p to one end portion of both ends portions, and the other assembly electrode 2020*b* can contact the probe pin p to the other end portion of both ends portions.

According to an embodiment of the present invention, the probe pin p can include a first probe pin p1 provided on one end side of both ends of the assembly electrode 2020 and a second probe pin p2 provided on the other end side of the assembly electrode 2020.

In addition, a plurality of first probe pins p1 and second probe pins p2 can be provided, for example, as many as the number of assembly electrodes 2020 respectively.

According to this, the first probe pin p1 can be in contact with the assembly electrode 2020*a* of any one of the two assembly electrodes 2020 forming the pair electrode 2021, the second probe pin p2 can be in contact with the other assembly electrode 2020*b*.

For example, when applying a voltage to the plurality of assembly electrodes 2020, the first probe pins p1 and the second probe pins p2 can sequentially or simultaneously contact the assembly electrodes 2020.

For example, the first probe pins p1 and the second probe pins p2 can be provided and mounted in a housing (not shown), by moving the housing in vertical and/or horizontal directions, the first and second probe pins p1 and p2 can be in contact with the assembly electrodes 2020.

Also, since the plurality of probe pins p can be separated from each other, the plurality of probe pins p can be driven independently. As such, the probe pins p can be driven in various ways and are not limited to a specific driving method.

In the present specification, matters related to the driving of the probe pins p are replaced with the above description, and will be omitted below.

On the other hand, when assembling at least two types of semiconductor light emitting devices 1050 among the semiconductor light emitting devices 1050 that emit red, green, and blue light on the substrate 2000, steps (a) to (d) described above can be repeatedly performed as follows.

First, in the step (a), the semiconductor light emitting devices 1050 emitting a first color (red, green, or blue) are put in the fluid chamber, and then steps (b) to (d) are performed.

When the assembly of the semiconductor light emitting devices emitting light of the first color is completed, next, a step of removing the semiconductor light emitting devices 1050 emitting light of the first color remaining in the fluid chamber can be performed.

After that, returning to the step (a) again, the semiconductor light emitting devices 1050 that emit a second color (a color different from the first color among red, green, or blue) in the fluid chamber are put in, the steps (b) to (d) are performed.

Meanwhile, in the step (d), an electric field can be formed by contacting the probe pin p only to the assembly electrodes 2020 of a specific line.

Specifically, the assembly electrodes 2020 can be divided into a plurality of groups according to the emission color of the semiconductor light emitting devices 1050 overlapping each of the assembly electrodes 2020.

For example, it can be divided into a first group consisting of assembly electrodes 2020R to which semiconductor light emitting devices 1050 emitting red light are assembled, a second group consisting of assembly electrodes 2020G on which green light emitting semiconductor light emitting devices 1050 are assembled, and a third group consisting of assembly electrodes 2020B to which the semiconductor light emitting devices 1050 emitting blue light are assembled.

A voltage can be selectively applied to the group of assembly electrodes 2020 according to the color emitted by the semiconductor light emitting devices 1050 injected into the fluid chamber. That is, when the semiconductor light emitting devices 1050 emitting red light in the fluid chamber are input, a voltage can be applied only to the assembly electrodes 2020R of the first group. And when the semiconductor light emitting devices 1050 that emit green light in the fluid chamber are input, a voltage can be applied only to the assembly electrodes 2020G of the second group. And when the semiconductor light emitting devices 1050 emitting blue light are input in the fluid chamber, a voltage can be applied only to the assembly electrodes 2020B of the third group. Here, the application of a voltage means that the probe pin p is brought into contact with the assembly electrodes 2020 of the corresponding group.

In this way, when assembling the semiconductor light emitting devices 1050 emitting light of a specific color, voltage is applied only to the assembly electrodes 2020 of a specific group, so that the semiconductor light emitting devices 1050 are disposed on the assembly electrodes 2020 of a specific line.

It is possible to assemble the semiconductor light emitting devices 1050 that emit light of different colors on the substrate 2000 through the above-described method, the substrate 2000 manufactured in the above manner can include semiconductor light emitting devices 1050 emitting red, green, and blue light.

Hereinafter, a method of applying a voltage signal to the assembly electrodes 2020 will be described in detail.

Figure 19:
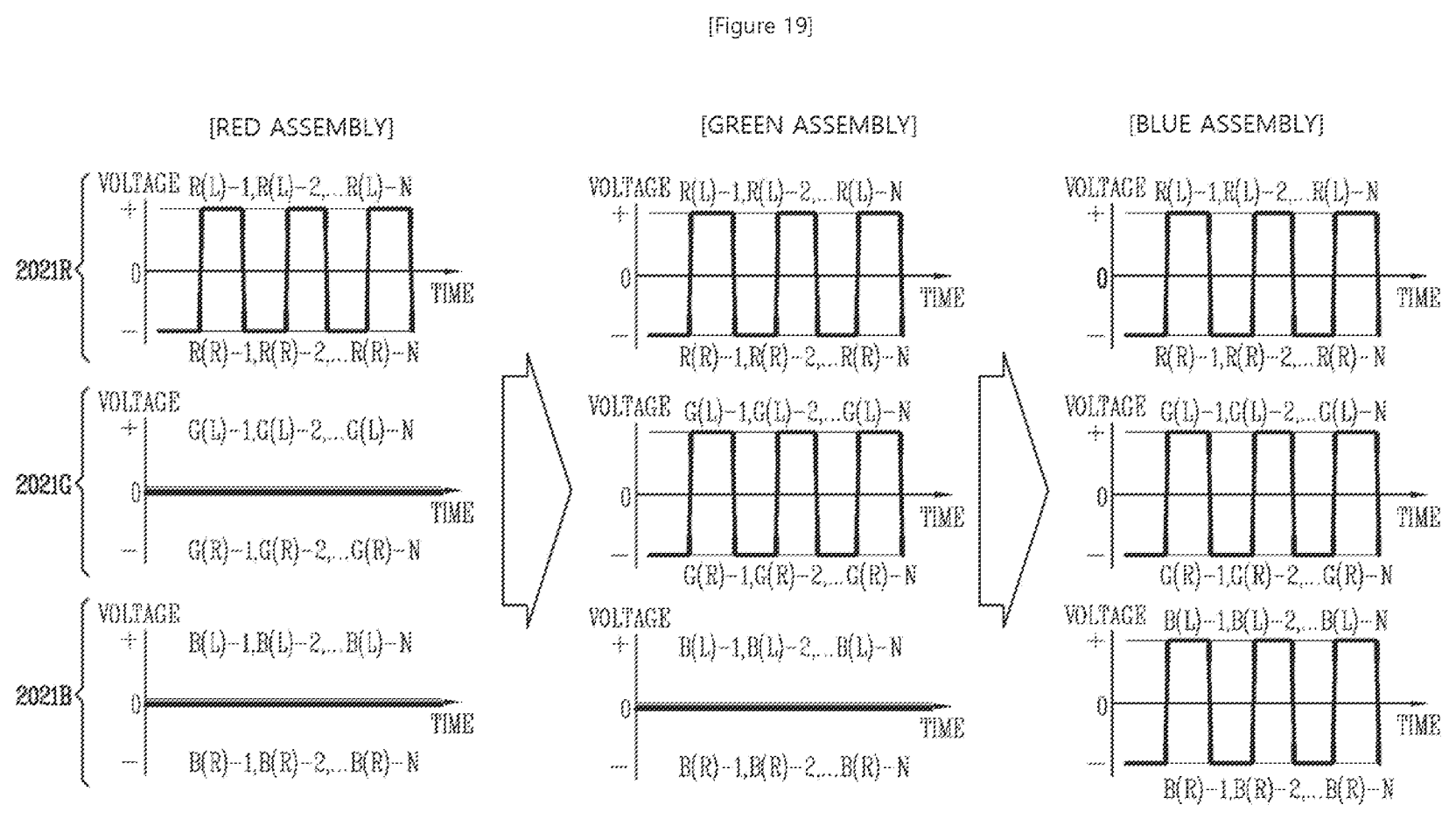

FIG. 18 is a conceptual diagram showing a voltage application method to the assembly electrodes according to an embodiment of the present invention, and FIG. 19 is a graph illustrating voltage signals applied to respective assembly electrodes when assembling RGB according to an embodiment of the present invention.

Referring to FIG. 18, a self-assembly apparatus can be used to apply a voltage to the assembly electrodes 2020. The self-assembly apparatus can include a power supply unit 3000, a control unit 4000, and a probe pin p.

The power supply unit 3000 can generate a voltage signal for forming an electric field, and the control unit 4000 can convert the voltage signal generated by the power supply unit 3000.

The probe pin p can apply the voltage signal converted by the controller 4000 to the assembly electrodes 2020, and the voltage can be applied to the assembly electrodes 2020 by contacting each of the assembly electrodes 2020 exposed through the open holes 2060.

The probe pin p can be connected to the power supply 3000 and the controller 4000 to apply a specific voltage signal to each of the assembly electrodes 2020. The controller 4000 can include a first controller 4000*a* connected to the first probe pins p1 and a second controller 4000*b* connected to the second probe pins p2. The first control unit 4000*a* and the second control unit 4000*b* can independently convert the voltage signal generated by the power supply unit 3000.

The voltage signal generated by the power supply unit 3000 can be applied to the assembly electrodes 2020 through the probe pin p. The power supply unit 3000 can generate an AC voltage signal.

The control unit 4000 can change the voltage signal generated by the power supply unit 3000 into a pulse form of a predetermined frequency so that a voltage difference is formed between one end portion and the other end portion of the assembly electrode 2020. Here, one end portion and the other end portion of the assembly electrode 2020 in which the voltage difference is formed can mean one end portion and the other end portion of any one electrode 2020*a* among the two assembly electrodes 2020 forming the pair electrode 2021.

On the other hand, as shown in FIG. 19, when assembling the semiconductor light emitting devices 1050 that emit red, green, and blue light on the substrate 2000, as described above, a voltage signal can be applied to the assembly electrodes 2021R, 2021G, and 2021B of a specific group as shown in the graph.

Specifically, when assembling the semiconductor light emitting devices 1050 that emit light of a first color, a step of forming an electric field by applying a voltage to the assembly electrodes 2020 corresponding to any one of the first to third groups can be performed. The semiconductor light emitting devices 1050 emitting light of the first color can be disposed on the group of assembly electrodes 2020 in which the electric field is formed. At this time, a voltage signal in the form of a pulse can be applied to the assembly electrodes 2020 of the group in which the electric field is formed, other groups of assembly electrodes 2020 can maintain a ground voltage state.

Next, when assembling the semiconductor light emitting devices 1050 that emit light of the second color, in order to maintain the pre-assembled semiconductor light emitting devices 1050 for emitting light of the first color to maintain a mounted state on the substrate 2000 and to prevent separation from the substrate 2000, while the voltage is continuously applied to the assembly electrodes 2020 to which the pre-voltage is applied, a new voltage can be applied to the assembly electrodes 2020 corresponding to another group.

In this way, the semiconductor light emitting devices 1050 that emit red, green, and blue light can be assembled on the substrate 2000.

As described above, according to an embodiment of the present invention, by the method in which a voltage is applied to the assembly electrodes 2020 by contacting the probe pin p to the assembly electrodes 2020 through the open hole 2060, it is possible to individually or selectively apply a voltage to each of the assembly electrodes 2020, so it is possible to control the voltage applied to each of the assembly electrodes 2020, and there is an effect that the semiconductor light emitting devices 1050 that emit red, green, and blue light can be efficiently assembled on the substrate 2000.

The method of manufacturing a display device according to an embodiment of the present invention can further include a step (e) detecting whether the assembly electrodes 2020 are defective, this step can also be performed using the probe pin (p).

Specifically, the step (e) can be performed by measuring resistance values of the assembly electrodes 2020 by contacting the probe pins p to some of both ends of the assembly electrodes 2020 exposed through the open holes 2060. Also when the measured resistance value is not included in the preset resistance value range, it can be determined that a defect exists in the corresponding assembly electrodes 2020.

According to an embodiment of the present invention, it is possible to detect whether the assembly electrodes 2020 are short-circuited or short-circuited.

FIG. 20 is a conceptual diagram showing a method for detecting whether the short circuit of the assembly electrodes according to an embodiment of the present invention, and FIG. 21 is a conceptual diagram illustrating a method of detecting whether a short circuit occurs between adjacent assembly electrodes according to an embodiment of the present invention.

First, by measuring a resistance value between both ends of each of the assembly electrodes 2020, it is possible to detect whether the individual assembly electrodes 2020 are short-circuited.

Detecting whether the individual assembly electrodes 2020 is short-circuited can be performed through the following steps.

First, a step of contacting the first probe pin p1 to the assembly electrodes 2020 exposed through the open hole 2060 on the one end side of the at least one or more assembly electrodes 2020 can be performed.

Next, a step of contacting the second probe pin p2 to the assembly electrodes 2020, exposed through the open hole 2060 on the other end side of the assembly electrodes 2020 to which the first probe pin 1 is in contact, can be performed.

Next, with respect to the assembly electrodes 2020 in which the first probe pin p1 and the second probe pin p2 are in contact, a step of measuring a resistance value between the first probe pin p1 and the second probe pin p2 can be performed.

When the resistance value measured in this way is not included in the preset resistance value range, the assembly electrode 2020 can be determined to have a short circuit defect.

In addition, a resistance value of one end portion of the first assembly electrode 2020a adjacent to each other among the assembly electrodes 2020 or a resistance value between the other end portion or one end portion of the second assembly electrode 2020b is measured. It is possible to detect whether there is a short between adjacent assembly electrodes 2020. In this case, the adjacent assembly electrodes 2020 are or are not assembly electrodes 2020 forming the pair electrode 2021.

Detection of a short circuit between adjacent assembly electrodes 2020 can be performed through the following steps.

First, a step of contacting the first probe pin p1 with the first assembly electrode 2020a exposed through the open hole 2060 on the one end side of the first assembly electrode 2020a can be performed, or a step of contacting the second probe pin p2 to the first assembly electrode 2020a exposed through the open hole 2060 on the other end side of the first assembly electrode 2020a can be performed.

Next, a step of contacting the second probe pin p2 to the second assembly electrode 2020b exposed through the open hole 2060 on the other end side of the second assembly electrode 2020b can be performed or a step of contacting the first probe pin p1 to the second assembly electrode 2020b exposed through the open hole 2060 on the one end side of the second assembly electrode 2020b can be performed.

Next, a step of measuring the resistance value between the first probe pin p1 in contact with the first assembly electrode 2020a and the second probe pin p2 in contact with the second assembly electrode 2020b can be performed or a step of measuring a resistance value between the second probe pin p2 in contact with the first assembly electrode 2020a and the first probe pin p1 in contact with the second assembly electrode 2020b can be performed.

When the resistance value measured in this way is not included in the preset resistance value range, it can be determined that there is a short defect between the adjacent corresponding assembly electrodes 2020.

The step of detecting whether the above-described assembly electrodes 2020 is defective can be performed before self-assembly, for example, it is preferably performed before the step of transferring the substrate 2000 to the assembly position.

According to an embodiment of the present invention, by forming an open hole 2060 to implement a structure in which a portion of both ends of the assembly electrode 2020 are exposed, and the probe pin p is brought into contact with the exposed assembly electrode 2020 portion, there is an effect that it is possible to simply and easily detect whether the assembly electrodes 2020 are defective.

The above-described present invention is not limited to the configuration and method of the embodiments described above, but the embodiments can be configured by selectively combining all or part of each embodiment so that various modifications can be made.

The invention claimed is:

1. A method of manufacturing a display device, the method comprising:

an operation (a) of introducing semiconductor light emitting devices including a magnetic material into a fluid chamber;

an operation (b) of transferring a substrate to the fluid chamber, the substrate comprising assembly electrodes, an insulating layer covering the assembly electrodes, and open holes in the insulating layer and exposing portions of both ends of the assembly electrodes;

an operation (c) of applying a magnetic force to the semiconductor light emitting devices introduced into the fluid chamber to move the semiconductor light emitting devices in one direction; and an operation (d) of forming an electric field so that the moving semiconductor light emitting devices are disposed at preset positions of the substrate, wherein in the operation (d), a probe pin is in contact with the assembly electrodes exposed through the open holes to individually apply a voltage to the assembly electrodes to form the electric field, wherein the substrate further comprises:

a base part on which the assembly electrodes are formed;

the insulating layer stacked on the base part to cover the assembly electrodes; and a barrier wall disposed on the insulating layer while forming a cell in which the semiconductor light emitting devices are disposed along an extension direction of the assembly electrodes to overlap a part of the assembly electrodes, and wherein the open holes are formed to pass through the insulating layer and the barrier wall.

2. A method of manufacturing a display device, the method comprising:

an operation (a) of introducing semiconductor light emitting devices including a magnetic material into a fluid chamber;

an operation (b) of transferring a substrate to the fluid chamber, the substrate comprising assembly electrodes, an insulating layer covering the assembly electrodes, and open holes in the insulating layer and exposing portions of both ends of the assembly electrodes;

an operation (c) of applying a magnetic force to the semiconductor light emitting devices introduced into the fluid chamber to move the semiconductor light emitting devices in one direction; and an operation (d) of forming an electric field so that the moving semiconductor light emitting devices are disposed at preset positions of the substrate, wherein in the operation (d), a probe pin is in contact with the assembly electrodes exposed through the open holes to individually apply a voltage to the assembly electrodes to form the electric field, and wherein, when assembling the semiconductor light emitting devices emitting light of at least two different colors on the substrate, performing the operation (a) after putting the semiconductor light emitting devices emitting a first color in the fluid chamber, and then performing the operations (b) to (d) for the semiconductor light emitting devices emitting the first color, and after removing the semiconductor light emitting devices emitting light of the first color remaining in the fluid chamber, again performing the operation (a) for the semiconductor light emitting devices emitting a second color that are introduced into the fluid chamber, and then performing the operations (b) to (d) for the semiconductor light emitting devices emitting the second color.

3. The method of manufacturing the display device according to claim 2, wherein the assembly electrodes are divided into a plurality of groups according to emission colors of overlapping semiconductor light emitting devices, and the electric field is formed by applying voltages to different groups according to colors emitted by the semiconductor light emitting devices introduced into the fluid chamber.

4. The method of manufacturing the display device according to claim 3, wherein the operation of forming the electric field comprises forming the electric field by applying the voltage to the assembly electrodes corresponding to any one of the plurality of groups and forming the electric field by applying the voltage to the assembly electrodes corresponding to the other group while maintaining the electric field formed by continuously applying the voltage to the assembly electrodes corresponding to the one group.

5. The method of manufacturing the display device according to claim 1, further comprising an operation (e) of detecting whether the assembly electrodes are defective by contacting the probe pin to a portion of both ends of the assembly electrodes exposed through the open holes to measure resistance values of the assembly electrodes, and when a measured resistance value is not included in a preset resistance value range, the assembly electrodes are determined to be defective.

6. The method of manufacturing the display device according to claim 5, wherein the probe pin comprises:

a plurality of first probe pins provided on one end side of an assembly electrode of the assembly electrodes and in contact with one end portion of the assembly electrode; and a plurality of second probe pins provided on the other end side of the assembly electrode and in contact with the other end portion of the assembly electrode.

7. The method of manufacturing the display device according to claim 6, wherein the operation (e) comprises an operation of detecting whether individual assembly electrodes are short-circuited by measuring resistance values between both ends of the respective assembly electrodes.

8. The method of manufacturing the display device according to claim 7, wherein the operation of detecting whether the individual assembly electrodes are short circuited comprises:

contacting a first probe pin of the plurality of first probe pins to the assembly electrodes exposed through the open holes on one end side of at least one or more of the assembly electrodes;

contacting a second probe pin of the plurality of second probe pins to the assembly electrodes exposed through the open holes on the other end side of the assembly electrodes in contact with the first probe pin; and measuring a resistance value between the first probe pin and the second probe pin of the assembly electrodes to which the first probe pin and the second probe pin are in contact.

9. The method of manufacturing the display device according to claim 6, wherein the operation (e) comprises an operation of detecting a short circuit between adjacent assembly electrodes by measuring a resistance value between one end portion or the other end portion of a first assembly electrode and the other end portion or one end portion of a second assembly electrode adjacent to the first assembly electrode respectively.

10. The method of manufacturing the display device according to claim 9, wherein the operation of detecting the short circuit between the adjacent assembly electrodes comprises:

contacting a first probe pin of the plurality first probe pins to the first assembly electrode exposed through the open holes on the one end side of the first assembly electrode or contacting a second probe pin of the plurality of second probe pins to the first assembly electrode exposed through the open holes on the other end side of the first assembly electrode;

contacting the second probe pin to the second assembly electrode exposed through the open holes on the other end side of the second assembly electrode or contacting the first probe pin to the second assembly electrode exposed through the open holes at one end side of the second assembly electrode; and measuring a resistance value between the first probe pin in contact with the first assembly electrode and the second probe pin in contact with the second assembly electrode or between the second probe pin in contact with the first assembly electrode and the first probe pin in contact with the first assembly electrode.

11. A self-assembly apparatus for forming an electric field so that semiconductor light emitting devices are assembled on a substrate, the substrate comprising assembly electrodes covered by an insulating layer having open holes exposing a portion of both ends of the assembly electrodes, the self-assembly apparatus comprising:

a power supply configured to generate a voltage signal;

a controller configured to convert the generated voltage signal to a predetermined form; and a probe pin configured to apply the converted voltage signal to the assembly electrodes, wherein the probe pin respectively contacts the assembly electrodes exposed through the open holes to apply a voltage to the assembly electrodes, and wherein the probe pin comprises:

a plurality of first probe pins provided on one end portion of the assembly electrodes and in contact with the one end portion of the assembly electrodes; and a plurality of second probe pins provided on the other end portion of the assembly electrodes and in contact with the other end portion of the assembly electrodes.

12. The self-assembly apparatus according to claim 11, wherein the controller comprises:

a first control connected to the plurality of first probe pins; and a second control connected to the plurality of second probe pins, wherein the first control and the second control independently convert the generated voltage signal.

13. The self-assembly apparatus according to claim 11, wherein a defectiveness of the assembly electrodes is detected by contacting the probe pin to a portion of both ends of the assembly electrodes exposed through the open holes to measure resistance values of the assembly electrodes.

14. The self-assembly apparatus according to claim 13, wherein when a measured resistance value among the resistance values is not included in a preset resistance value range, the assembly electrodes are determined to be defective.

15. The self-assembly apparatus according to claim 11, wherein a short-circuit between adjacent assembly electrodes is determined by measuring a resistance value between both ends of the adjacent assembly electrodes, respectively.

16. The self-assembly apparatus according to claim 15, wherein the short-circuit between the adjacent assembly electrodes is determined by measuring a resistance value between a first probe pin in contact with the assembly electrodes exposed through the open holes on one end side of the plurality of first probe pins and a second probe pin in contact with the assembly electrodes exposed through the open holes on the other end side of the plurality of second probe pins.

* * * * *